US011328986B2

(12) United States Patent
Aleksov et al.

(10) Patent No.: US 11,328,986 B2
(45) Date of Patent: May 10, 2022

(54) CAPACITOR-WIREBOND PAD STRUCTURES FOR INTEGRATED CIRCUIT PACKAGES

(71) Applicant: INTEL CORPORATION, Santa Clara, CA (US)

(72) Inventors: Aleksandar Aleksov, Chandler, AZ (US); Feras Eid, Chandler, AZ (US); Georgios Dogiamis, Chandler, AZ (US); Telesphor Kamgaing, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/554,288

(22) Filed: Aug. 28, 2019

(65) Prior Publication Data

US 2021/0066184 A1    Mar. 4, 2021

(51) Int. Cl.
*H01L 23/522*    (2006.01)
*H01L 49/02*    (2006.01)
*H01L 23/00*    (2006.01)
*H01L 23/495*    (2006.01)

(52) U.S. Cl.
CPC .... *H01L 23/5223* (2013.01); *H01L 23/49513* (2013.01); *H01L 24/85* (2013.01); *H01L 28/40* (2013.01)

(58) Field of Classification Search
CPC .. H01I 23/5223; H01I 23/49513; H01I 24/85; H01I 28/40
See application file for complete search history.

(56) References Cited

U.S. PATENT DOCUMENTS

| 5,103,283 | A | * | 4/1992 | Hite | H01L 23/642 |
| | | | | | 257/724 |
| 5,912,044 | A | * | 6/1999 | Farooq | H01L 28/40 |
| | | | | | 427/79 |
| 2013/0285121 | A1 | * | 10/2013 | Zampardi, Jr. | H01L 29/365 |
| | | | | | 257/197 |
| 2014/0360760 | A1 | * | 12/2014 | Kiwanami | H05K 3/4697 |
| | | | | | 174/251 |
| 2017/0288642 | A1 | * | 10/2017 | Eid | H03H 9/17 |
| 2018/0086627 | A1 | * | 3/2018 | Lin | B81B 7/007 |
| 2019/0139883 | A1 | * | 5/2019 | Gandhi | H01L 23/3121 |
| 2020/0136611 | A1 | * | 4/2020 | Godfrey | H01S 5/02234 |

OTHER PUBLICATIONS

U.S. Appl. No. 16/400,768, filed May 1, 2019, entitled "In Situ Package Integrated Thin Film Capacitors for Power Delivery;" First Named Inventor Thomas Sounart.

* cited by examiner

*Primary Examiner* — Vongsavanh Sengdara
(74) *Attorney, Agent, or Firm* — Patent Capital Group

(57) ABSTRACT

Disclosed herein are capacitor-wirebond pad structures for integrated circuit (IC) packages, as well as related methods and devices. For example, in some embodiments, an IC package may include a die and an IC package support. The IC package support may include a capacitor, and the capacitor may include a first capacitor plate, a second capacitor plate, and a capacitor dielectric between the first capacitor plate and the second capacitor plate. The die may be wirebonded to the first capacitor plate.

20 Claims, 12 Drawing Sheets

CAPACITOR-WIREBOND PAD STRUCTURES FOR INTEGRATED CIRCUIT PACKAGES

BACKGROUND

Some integrated circuit (IC) packages include IC dies and additional passive components. Typically, such passive components are separately manufactured as discrete components and mounted to a surface of the package substrate.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
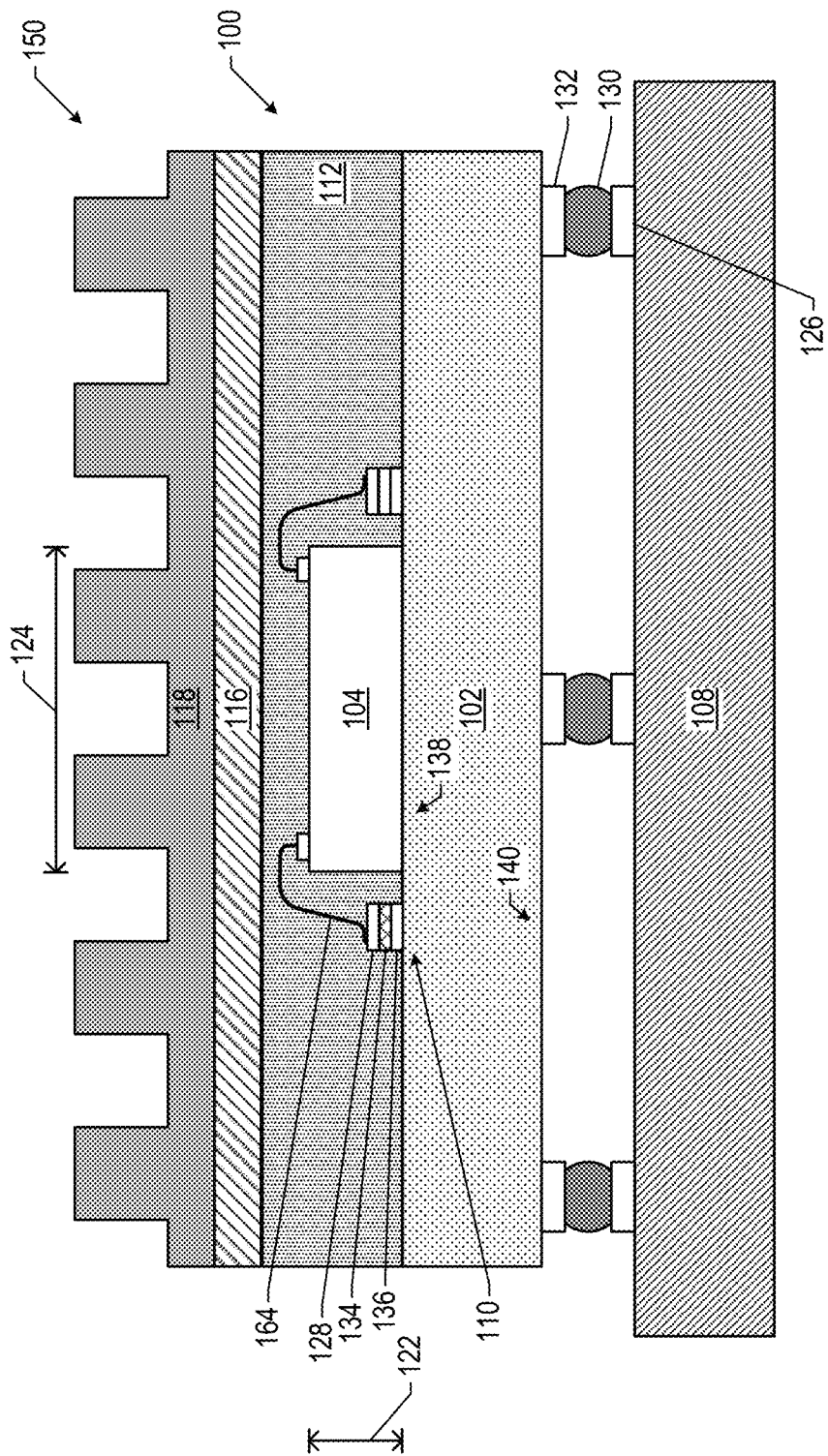
FIG. 1 is a side, cross-sectional view of an integrated circuit (IC) assembly including an IC package with a capacitor-wirebond pad structure in a package substrate, in accordance with various embodiments.

Disclosed herein are capacitor-wirebond pad structures for integrated circuit (IC) packages, as well as related methods and devices. For example, in some embodiments, an IC package may include a die and an IC package support. The IC package support may include a capacitor, and the capacitor may include a first capacitor plate, a second capacitor plate, and a capacitor dielectric between the first capacitor plate and the second capacitor plate. The die may be wirebonded to the first capacitor plate.

For many electronic technologies, the drive towards smaller devices with greater functionality runs up against limitations in conventional manufacturing technology. For example, next-generation 5G wireless communication devices may require additional hardware to accommodate an increasing number of filters and communication bands. Such additional hardware has typically included additional surface-mounted passive devices, such as capacitors. However, accommodating such additional hardware has typically required increasing the overall device size.

Disclosed herein are structures and techniques in which capacitors and wirebond pads are integrated into an IC package support (e.g., an interposer or a substrate). Such capacitor-wirebond pad structures may incorporate capacitor functionality without increasing the footprint of the device, and while allowing wirebonds to be formed using conventional approaches. Consequently, the embodiments disclosed herein may enable the manufacture of hardware that is compactly integrated into desirably sized devices, accelerating adoption of next-generation communication technology and facilitating its use in a broader array of devices. The capacitor-wirebond pad structures disclosed herein may be particularly beneficial as part of power delivery circuitry and/or radio frequency (RF) communication circuitry. Further, the capacitor-wirebond pad structures disclosed herein may simplify the IC package assembly process, reducing cost and accelerating product rollout.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. As used herein, a "high-k dielectric" refers to a dielectric material having a dielectric constant greater than that of silicon oxide. When used to describe a range of dimensions, the phrase "between X and Y" represents a range that includes X and Y. For ease of discussion, the phrase "FIG. 3" may be used to refer to the collection of drawings of FIGS. 3A-3J.

A number of examples of capacitor-wirebond pad structures 110 in IC packages are disclosed herein. Although different ones of these capacitor-wirebond pad structures 110 may be separately discussed for ease of illustration, any suitable ones of these capacitor-wirebond pad structures 110, or features thereof, may be combined in an IC package. For example, any of the features of the capacitor-wirebond pad structures 110 of FIG. 2 may be used in any suitable combination with any of the features of the capacitor-wirebond pad structures 110 of FIGS. 4-8. These particular examples of combinations are simply illustrative, and any suitable combination of any of the embodiments disclosed herein are within the scope of this disclosure.

FIG. 1 is a side, cross-sectional view of an IC assembly 150 including an IC package 100 with a capacitor-wirebond pad structure 110 in a package substrate 102, in accordance with various embodiments. The capacitor-wirebond pad structure 110 includes a first capacitor plate 128 (which also serves as a wirebond pad, as discussed below), a second capacitor plate 136, and a capacitor dielectric 134 between the first capacitor plate 128 and the second capacitor plate 136. A conductive pathway (not shown) may couple the second capacitor plate 136 to one of the faces 138/140 of the package substrate 102 or to a component embedded in the package substrate 102 (not shown). An IC die 104 is coupled to the package substrate 102 by a bondwire 164 conductively coupled between the IC die 104 and the first capacitor plate 128. The bondwire 164 may include any suitable conductive material (e.g., aluminum, copper, silver, or gold), and may be bonded to the first capacitor plate 128 using any suitable wirebonding technique (e.g., ball bonding, wedge bonding, or compliant bonding). The capacitor-wirebond pad structure 110 thus acts as a capacitor between the IC die 104 and the conductive pathway (not shown) that couples to the second capacitor plate 136 through the package substrate 102.

The IC die 104 may be any suitable device, such as a processing die, a memory die, a power amplifier, a switching die, a resonator, etc. Although FIG. 1 depicts only a single IC die 104, this is simply for ease of illustration, and any of the IC packages 100 or IC assemblies 150 disclosed herein may include any desired number of additional components (or fewer components, as appropriate). For example, any of the IC packages 100 disclosed herein may include passive components (e.g., resistors, inductors, capacitors, or combinations thereof) disposed at either face of the package substrate 102 or in any other suitable location. In another example, any of the IC packages 100 disclosed herein may include active components (e.g., transistors) disposed at either face of the package substrate 102, embedded in the package substrate 102, or in any other suitable location.

As noted above, the package substrate 102 may include a face 140 and an opposing face 138, and the first capacitor plate 128 may be exposed at the face 138. The package substrate 102 may include a dielectric material (e.g., a ceramic, a buildup film, an epoxy film having filler particles therein, glass, an organic material, an inorganic material, combinations of organic and inorganic materials, embedded portions formed of different materials, etc.), and may have conductive pathways extending through the dielectric material between the faces 138 and 140, or between different locations on the face 138, and/or between different locations on the face 140. In particular, the package substrate 102 may include a conductive pathway in conductive contact with the second capacitor plate 136, allowing the capacitor-wirebond pad structure 110 to act as a capacitor between the IC die 104 and this conductive pathway. These conductive pathways may take the form of any of the interconnect structures 1628 discussed below with reference to FIG. 11 (e.g., including lines and vias). Conductive contacts other than wirebond pads may be present at the face 138 and/or at the face 140, as desired. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

As illustrated in FIG. 1, conductive contacts 132 may be disposed at the face 140 of the package substrate 102, and solder balls 130 may be disposed thereon. In some embodiments, conductive pathways (not shown) in the package substrate 102 may electrically couple the conductive contacts 132 to the capacitor-wirebond pad structure 110.

In the IC assembly 150 of FIG. 1, the IC package 100 is illustrated is coupled to a circuit board 108 (e.g., a motherboard); in particular, the conductive contacts 132 may be electrically coupled to conductive contacts 126 of the circuit board 108 by the solder balls 130 (e.g., for a ball grid array (BGA) package), but any suitable interconnects may be used (e.g., pins in a pin grid array (PGA) package or lands in a land grid array (LGA) package). In other IC assemblies, an IC package 100 (e.g., in accordance with any of the embodiments disclosed herein) may be coupled to another IC package, a package interposer, or any other suitable support that may take the place of the circuit board 108. In some such embodiments, the package substrate 102 may itself act as an interposer in an IC package or assembly having another package substrate. Thus, although the capacitor-wirebond pad structures 110 disclosed herein may be discussed as included in a package substrate 102, the capacitor-wirebond pad structures 110 disclosed herein may be included in any suitable package support (e.g., an interposer, a bridge, etc.). Further, although the IC package 100 of FIG. 1 (and others of the accompanying drawings) includes IC die 104 coupled directly to the package substrate 102, in any of the embodiments disclosed herein, an intermediate component may be disposed between the IC die 104 and the package substrate 102 (e.g., an interposer, a silicon bridge, an organic bridge, etc.).

The IC package 100 may further include a mold compound 112 disposed around the IC die 104. In some embodiments, the mold compound 112 may include an epoxy matrix with one or more filler materials (e.g., silica).

The IC assembly 150 of FIG. 1 also includes a heat sink 118 and a thermal interface material (TIM) 116 between the mold compound 112 and the IC package 100. The TIM 116 may aid in the transfer of heat from the IC package 100 to the heat sink 118, and the heat sink 118 may be designed to readily dissipate heat into the surrounding environment, as known in the art (e.g., using fins, as shown). In some embodiments, the TIM 116 may be a polymer TIM or a solder TIM. Any of the IC packages 100 disclosed herein may be part of an IC assembly 150 including a heat sink 118 and a TIM 116.

The dimensions of the elements of the IC package 100 of FIG. 1 (and others of the accompanying figures) may take any suitable values. For example, in some embodiments, a height 122 of the IC die 104 may be between 100 microns and 800 microns. In some embodiments, a width 124 of the IC die 104 may be between 0.5 millimeters and 10 millimeters (e.g., between 1 millimeter and 5 millimeters).

As noted above, one or more capacitor-wirebond pad structures 110 may be included in the package substrate 102. Although FIG. 1 illustrates the second capacitor plate 136 of the capacitor-wirebond pad structure 110 as extending away from the rest of the face 138 of the package substrate 102, this is simply illustrative, and in other embodiments, the second capacitor plate 136, the capacitor dielectric 134, and/or the first capacitor plate 128 may be flush with or recessed from the rest of the face 138 (with the "top" surface of the first capacitor plate 128 exposed for attachment to the bondwire 164). Further, although FIG. 1 illustrates a pair of capacitor-wirebond pad structures 110 in the package substrate 102, a package substrate 102 may include any desired number of capacitor-wirebond pad structures 110; for example, FIG. 9, discussed below, includes a number of examples of arrangements of multiple capacitor-wirebond pad structures 110.

Figure 2:
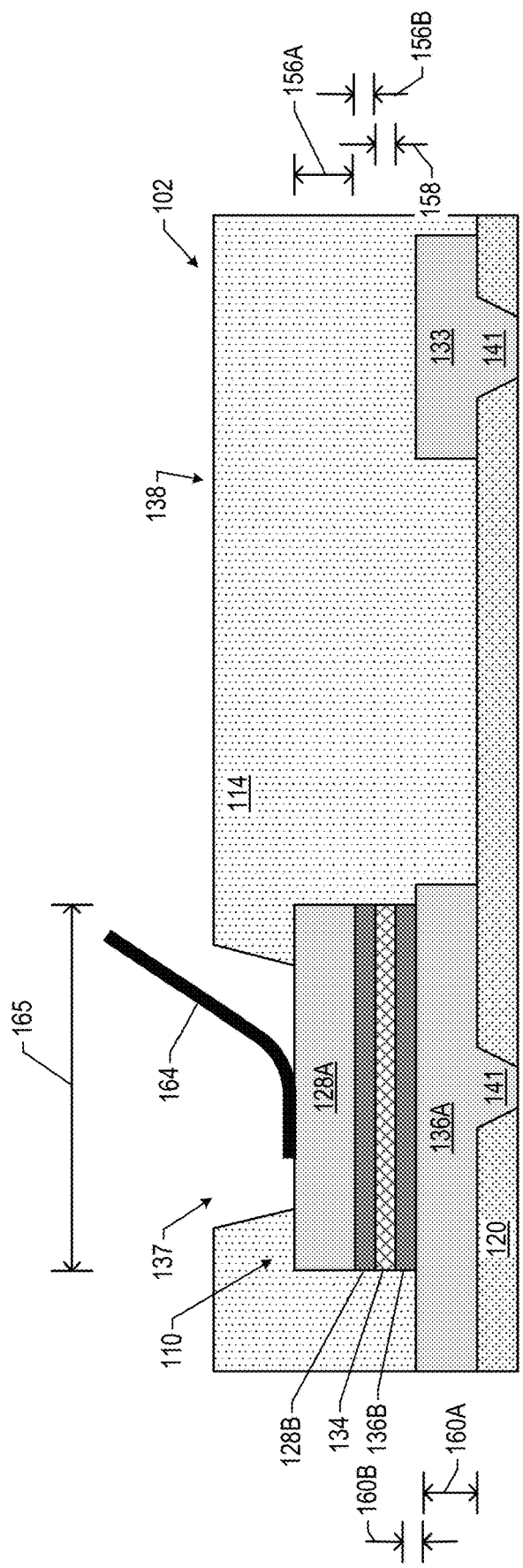
FIG. 2 is a side, cross-sectional view of an example of a capacitor-wirebond pad structure in a package substrate, in accordance with various embodiments.

The capacitor-wirebond pad structures 110 disclosed herein may take any suitable form. For example, FIG. 2 is a side, cross-sectional view of an example of a capacitor-wirebond pad structure 110 in a package substrate 102, in accordance with various embodiments. The capacitor-wirebond pad structure 110 of FIG. 2 includes a first capacitor plate 128 (including a first material 128A and a second material 128B), a second capacitor plate 136 (including a first material 136A and a second material 136B), and a capacitor dielectric 134 between the first capacitor plate 128 and the second capacitor plate 136. In particular, the second material 128B is between the first material 128A and the capacitor dielectric 134, and the second material 136B is between the first material 136A and the capacitor dielectric 134. A bondwire 164 is shown as bonded to the exposed top surface of the first material 128A of the first capacitor plate 128; as known in the art, the wirebond between the bondwire 164 and the first capacitor plate 128 may be formed when the IC die 104 is attached to the package substrate 102, after manufacture of the package substrate 102 is complete. A resist material 114 (e.g., a solder resist) may be in contact with the capacitor-wirebond pad structure 110, and an opening 137 in the resist material 114 may expose a portion of the top surface of the first capacitor plate 128. The package substrate 102 may include additional metal and dielectric layers, not shown, below the portion illustrated in FIG. 2.

A conductive via 141 through a dielectric material 120 may be in contact with the second capacitor plate 136 (in particular, with the first material 136A); that conductive via 141 may be part of a larger conductive pathway (not shown) through the package substrate 102, and as noted above, the capacitor-wirebond pad structure 110 may act as a capacitor between the bondwire 164 and this conductive pathway. Although the conductive via 141 is labeled separately from the second capacitor plate 136, it is noted that these structures may be formed together (e.g., in accordance with a semi-additive process) in some embodiments. The dielectric material 120 may be any suitable package substrate dielectric, such as an organic dielectric. In some embodiments, the first material 136A of the second capacitor plate 136 may be formed simultaneously with other conductive portions 133 in a common metal layer of the package substrate 102. This common metal layer may be the "topmost" metal layer of the package substrate 102, as shown, in some embodiments. In some embodiments, therefore, the capacitor-wirebond pad structures 110 disclosed herein may be parallel plate capacitors built into the top metal layer of the package substrate 102, the same metal layer that may include conventional wirebond pads.

In some embodiments, the capacitor-wirebond pad structure 110 may be part of power delivery circuitry that delivers power and/or ground signals to the IC die 104. In some embodiments, the capacitor-wirebond pad structure 110 may be part of RF circuitry (e.g., the capacitor-wirebond pad structure 110 may be part of a filter circuit for performing RF communications in particular frequency bands). In some embodiments, the IC package 100 may be a system-in-package (SiP) (e.g., an RF SiP). Utilizing the capacitor-wirebond pad structures 110 disclosed herein, instead of discrete, surface-mounted capacitors, may make the pathway between the capacitor and the IC die 104 more direct, and may reduce parasitics that can negatively impact the performance of RF and power delivery circuits.

Any suitable materials may be used for the first capacitor plate 128, the second capacitor plate 136, and capacitor dielectric 134 of a capacitor-wirebond pad structure 110. In some embodiments, the capacitor dielectric 134 may include a dielectric material with a relative dielectric constant between 20 and 120. In some such embodiments, the capacitor dielectric 134 may include tantalum and oxygen (e.g., in the form of tantalum oxide), zirconium and oxygen (e.g., in the form of zirconium oxide), hafnium and oxygen (e.g., in the form of hafnium oxide), or titanium and oxygen (e.g., in the form of titanium oxide). In some embodiments, the capacitor dielectric 134 may include an ultra-high-k material (e.g., a material having a dielectric constant greater than 120). In some such embodiments, the capacitor dielectric 134 may include barium, strontium, titanium, and oxygen (e.g., in the form of barium strontium titanate); or barium, titanium, and oxygen (e.g., in the form of barium titanate). A capacitor dielectric 134 may be fabricated using any suitable technique, such as deposition techniques for continuous films.

As noted above, the first capacitor plate 128 may include a first material 128A and a second material 128B, with the second material 128B between the capacitor dielectric 134 and the first material 128A. In some embodiments, the second material 128B (in contact with the capacitor dielectric 134) may be selected to have a low leakage current in conjunction with the capacitor dielectric 134. In some embodiments, when the capacitor dielectric 134 includes a metallic element, the second material 128B may include that metallic element (e.g., when the capacitor dielectric 134 includes tantalum oxide, the second material 128B may be tantalum; when the capacitor dielectric 134 includes zirconium oxide, the second material 128B may be zirconium; when the capacitor dielectric 134 includes hafnium oxide, the second material 128B may be hafnium; or when the capacitor dielectric 134 includes titanium oxide, the second material 128B may be titanium). The first material 128A may be a metal having good band alignment and low leakage current in conjunction with the capacitor dielectric 134. In some embodiments, the first material 128A may include nickel, palladium, or copper. In some embodiments, the first capacitor plate 128 may not include a first material 128A and a second material 128B with different material compositions, but may have a uniform material composition (e.g., as discussed below with reference to FIG. 5).

As noted above, the second capacitor plate 136 may include a first material 136A and a second material 136B, with the second material 136B between the capacitor dielectric 134 and the first material 136A. The first material 136A may take any of the forms of the first material 128A discussed herein, and the second material 136B may take any of the forms of the second material 128B discussed herein. In some embodiments, the second capacitor plate 136 may not include a first material 136A and a second material 136B with different material compositions, but may have a uniform material composition (e.g., as discussed below with reference to FIG. 5). The capacitor-wirebond pad structure 110 of FIG. 2 also illustrates the right side surface of the first capacitor plate 128/capacitor dielectric 134 being offset from the right side surface of the second capacitor plate 136, causing a a "step" in the profile of the capacitor-wirebond pad structure 110; in some embodiments, such a step may not be present (e.g., as discussed below with reference to FIG. 4).

The dimensions of the capacitor-wirebond pad structures 110 disclosed herein may take any suitable values. For example, in some embodiments, a thickness 156A of the first material 128A may be between 1 micron and 20 microns (e.g., between 1 micron and 15 microns). In some embodiments, a thickness 160A of the first material 136A may be between 1 micron and 20 microns (e.g., between 1 micron and 15 microns). In some embodiments, a thickness 156B of the second material 128B may be between 5 nanometers and 100 nanometers. In some embodiments, a thickness 160B of the second material 136B may be between 5 nanometers and 100 nanometers. In some embodiments, a thickness 158 of the capacitor dielectric 134 may be between 5 nanometers and 400 nanometers. In some embodiments, the sum of the thicknesses 156B, 158, and 160B may be between 40 nanometers and 600 nanometers (e.g., between 40 nanometers and 150 nanometers). In some embodiments, a side length or diameter 165 of a first capacitor plate 128 may be between 10 microns and 100 microns. In some embodiments, an area of a first capacitor plate 128 may be between 0.005 square millimeters and 0.5 square millimeters. In some embodiments, a capacitance of a capacitor-wirebond pad structure 110 may be between 1 picofarad and 10 nanofarads.

The capacitor-wirebond pad structures 110 disclosed herein may be manufactured using any suitable technique. For example, FIGS. 3A-3J are side, cross-sectional views of stages in an example process for manufacturing the capacitor-wirebond pad structure 110 of FIG. 2, in accordance with various embodiments. Although FIG. 3 illustrates various operations performed in a particular order, this is simply illustrative, and the operations discussed herein may be reordered and/or repeated as suitable. Further, various ones of the operations discussed below with respect to FIG. 3 may be modified, in accordance with the present disclosure to manufacture others of the capacitor-wirebond pad structures 110 disclosed herein (e.g., the capacitor-wirebond pad structures 110 discussed below with reference to FIGS. 4-9).

Figure 3A:
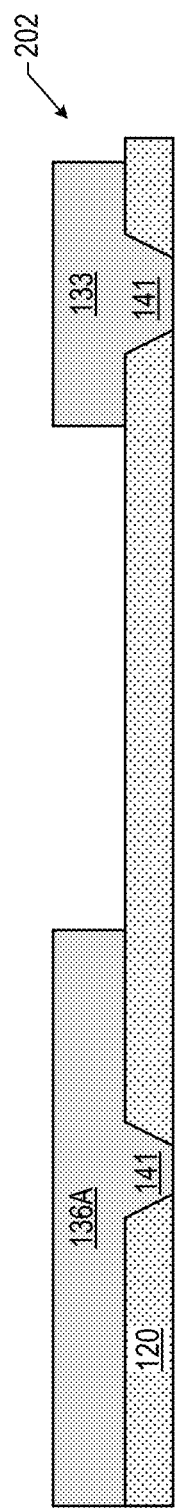
FIGS. 3A-3J are side, cross-sectional views of stages in an example process for manufacturing the capacitor-wirebond pad structure of FIG. 2, in accordance with various embodiments.

FIG. 3A illustrates an assembly 202 including a dielectric material 120, vias 141 through the dielectric material 120, the first material 136A of the second capacitor plate 136 in contact with one of the vias, and a conductive portion 133 in contact with another of the vias. The first material 136A and the conductive portion 133 may be part of a same metal layer, and the assembly 202 may be fabricated using conventional printed circuit board (PCB) technology (e.g., with copper interconnects having thicknesses between 2 microns and 50 microns). Any suitable manufacturing technique (such as additive, subtractive, semi-additive, etc.) may be used to manufacture the assembly 202. The assembly 202 may include additional metal and dielectric layers, not shown, below the portion illustrated in FIG. 3A.

Figure 3B:
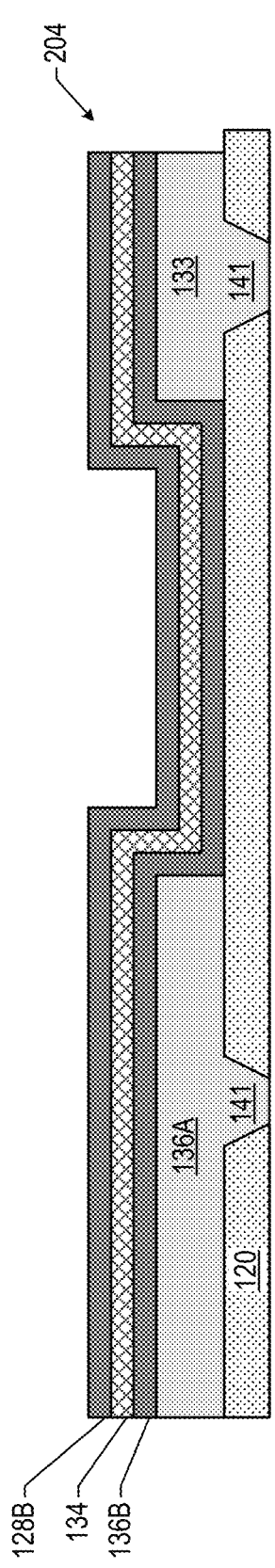

FIG. 3B illustrates an assembly 204 subsequent to conformally depositing a layer of second material 136B, a layer of capacitor dielectric 134, and a layer of second material 128B on the assembly 202 (FIG. 3A). The layers may be deposited to any desired thickness using any suitable technique (e.g., sputtering, physical vapor deposition (PVD), or atomic layer deposition (ALD)).

Figure 3C:
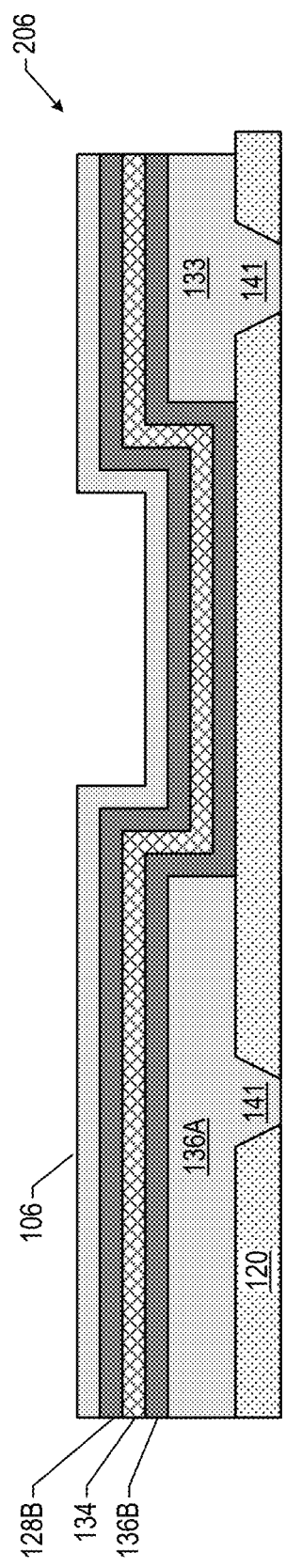

FIG. 3C illustrates an assembly 206 subsequent to conformally depositing a metal seed layer 106 on the second material 128B of the assembly 204 (FIG. 3B). The metal seed layer 106 may have the material composition of the first material 128A, and may be deposited to facilitate the plating of the remainder of the first material 128A, as discussed below.

Figure 3D:
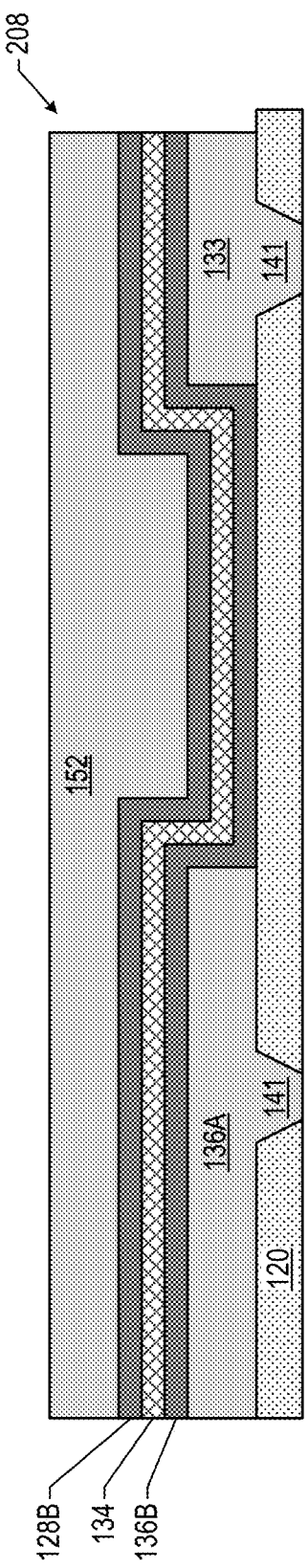

FIG. 3D illustrates an assembly 208 subsequent to plating additional metal on the metal seed layer 106 of the assembly 206 (FIG. 3C) to form the metal 152. The metal 152 may have the same material composition as the first material 128A. In other embodiments, a process other than plating (e.g., sputtering) may be used to form the metal 152; in such embodiments, no initial metal seed layer 106 may be deposited.

Figure 3E:
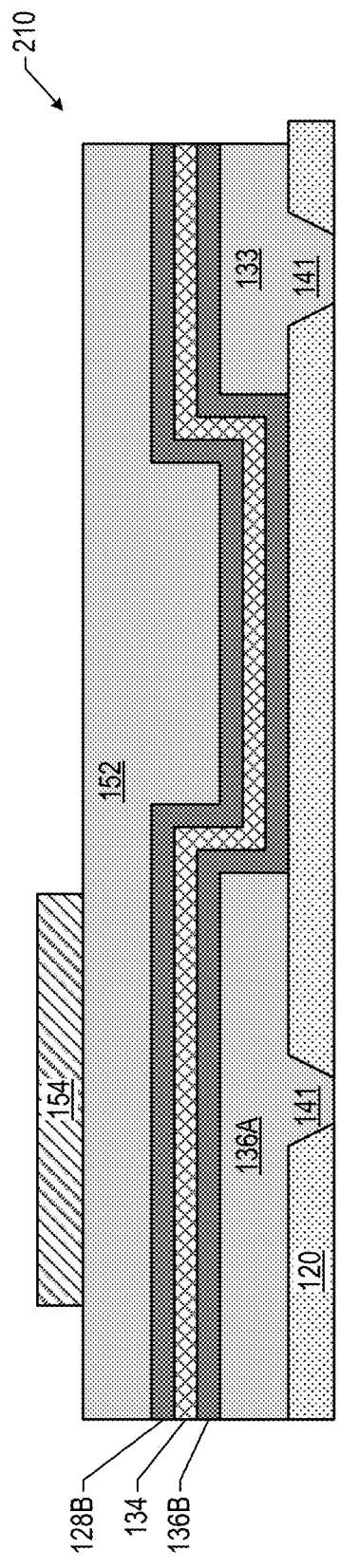

FIG. 3E illustrates an assembly 210 subsequent to depositing and patterning a photoresist material 154 on the surface of the metal 152 of the assembly 208 (FIG. 3D). The deposition and patterning of the photoresist material 154 may use any known techniques (e.g., spin-coating, etc.). The photoresist material 154 may be left in place in the area corresponding to the desired location of the first capacitor plate 128, as discussed further below.

Figure 3F:
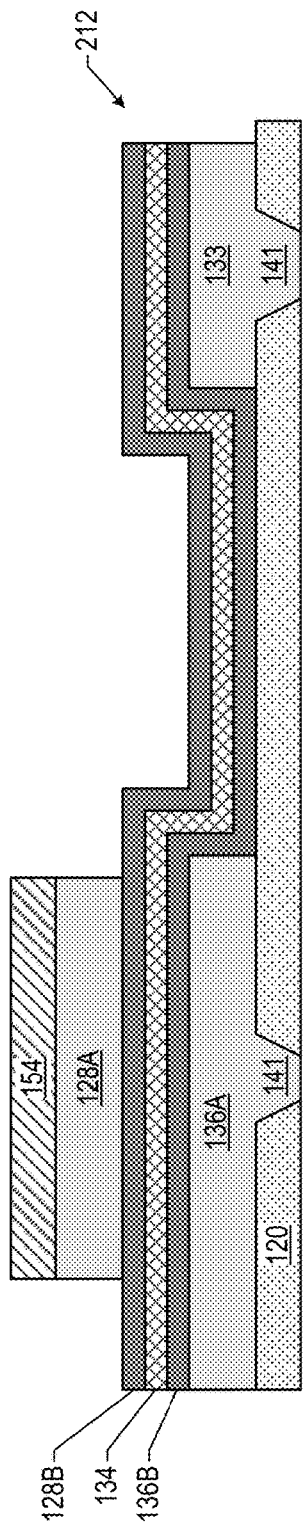

FIG. 3F illustrates an assembly 212 subsequent to using the photoresist material 154 as a mask and etching the underlying metal 152 of the assembly 210 (FIG. 3E). The etch may remove all of the metal 152 not protected by the photoresist material 154, leaving the first material 128A. The etch may be selective so as to stop at the second material 128B. In some embodiments, the etch that removes the metal 152 may be isotropic, and may "undercut" the photoresist material 154 so that the footprint of the first material 128A is smaller than the footprint of the photoresist material 154. In some alternate approaches, the metal seed layer 106 itself may be deposited, the photoresist material 154 may be deposited, and the photoresist material 154 may be "negatively" patterned so that it is present everywhere except the desired location for the first capacitor plate 128; a plating operation may then be performed to form the first material 128A, overburden of the first material 128A and the photoresist material 154 may then be removed, and a seed etch may be performed to remove the remaining metal seed layer 106.

Figure 3G:
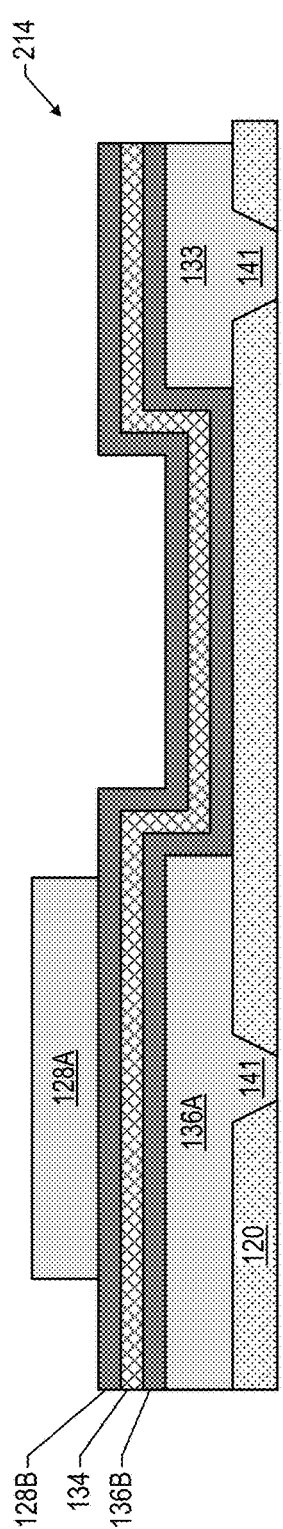

FIG. 3G illustrates an assembly 214 subsequent to removing the photoresist material 154 from the assembly 212 (FIG. 3F) using a wet clean process, for example.

Figure 3H:
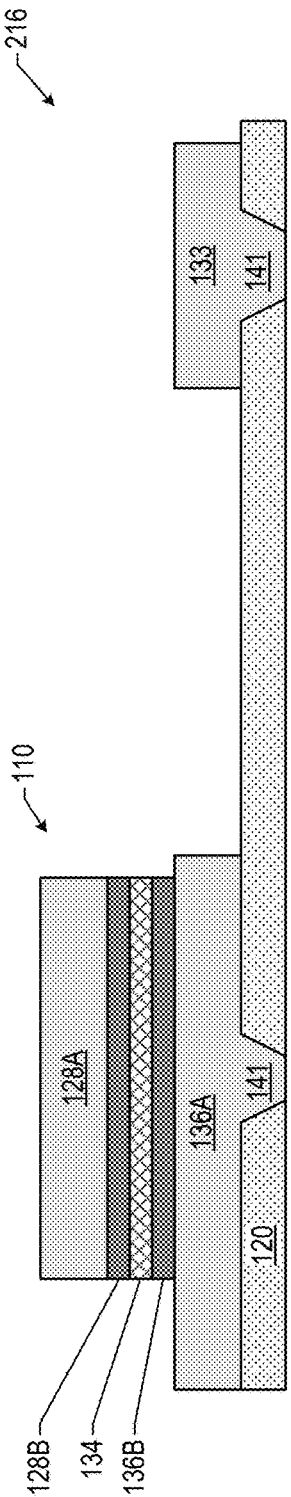

FIG. 3H illustrates an assembly 216 subsequent to using the first material 128A as a mask and etching the underlying second material 128B/capacitor dielectric 134/second material 128B of the assembly 214 (FIG. 3G). The etch may remove all of the second material 128B/capacitor dielectric 134/second material 128B not protected by the first material 128A, leaving the first material 128A. The etch may be selective so as to stop at the first material 136A/dielectric material 120. The assembly 216 may include the capacitor-wirebond pad structure 110, as shown.

Figure 3I:
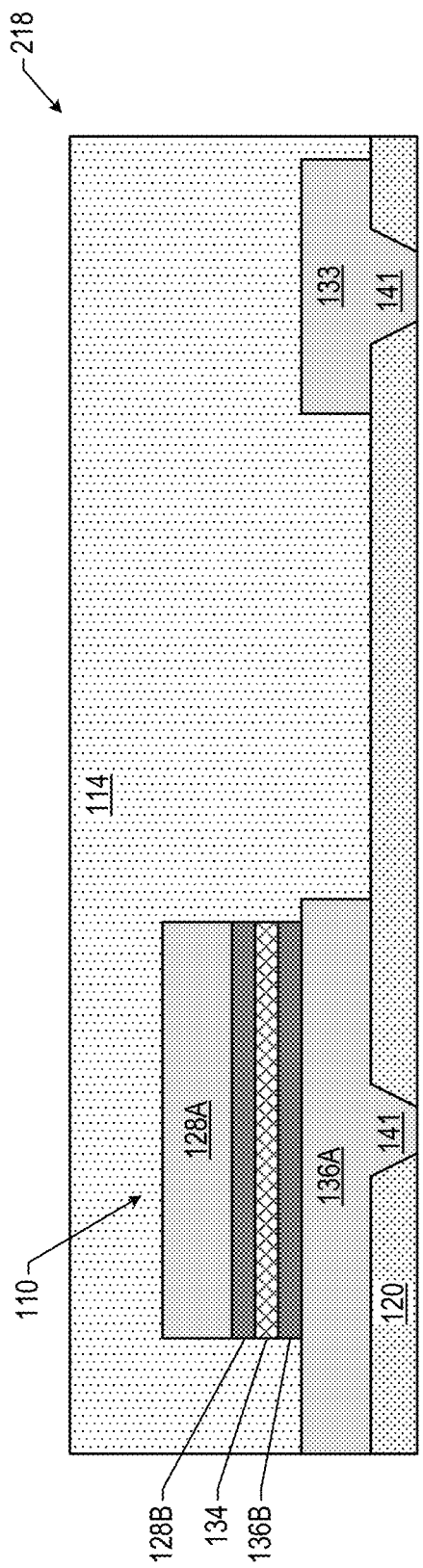

FIG. 3I illustrates an assembly 218 subsequent to depositing a resist material 114 over the surface of the assembly 216 (FIG. 3H). The resist material 114 may be deposited using any suitable technique (e.g., spin-coating, lamination, etc.)

Figure 3J:
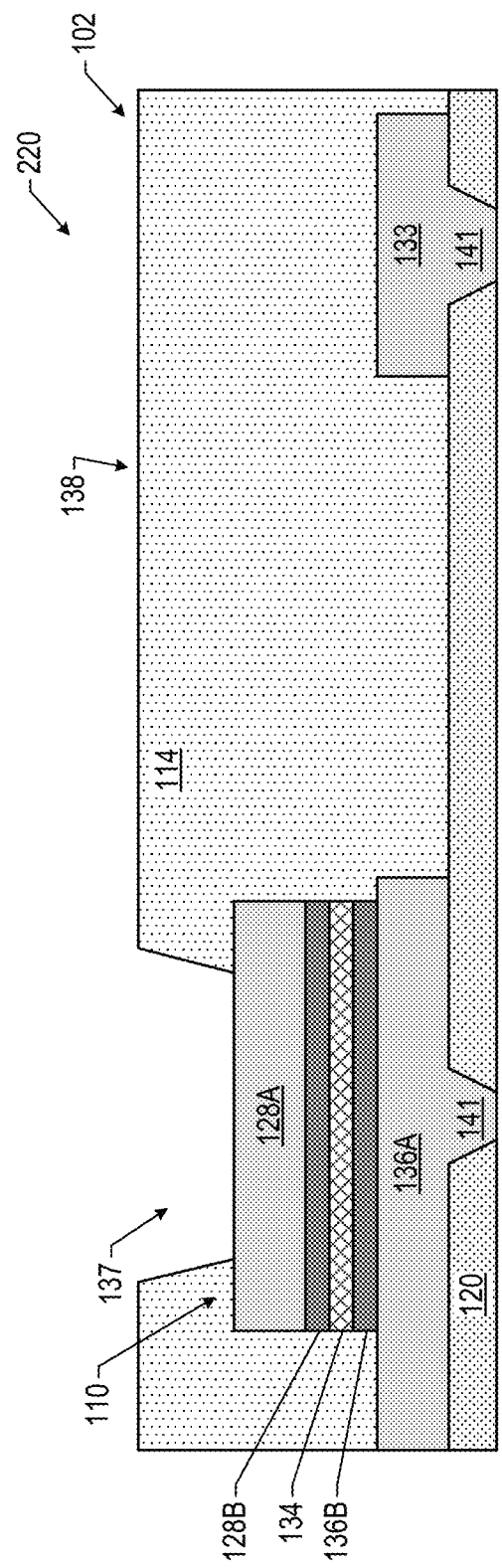

FIG. 3J illustrates an assembly 220 subsequent to forming an opening 137 in the resist material 114 of the assembly 218 (FIG. 3I) to expose a top surface of the first capacitor plate 128. The resulting assembly 220 may take the form of the package substrate 102 of FIG. 2.

FIGS. 4-8 are side, cross-sectional views of other example capacitor-wirebond pad structures 110, in accordance with various embodiments. As noted above, any of the features of the capacitor-wirebond pad structures 110 of FIGS. 4-8 may be combined as suitable with any of the features of any of the other capacitor-wirebond pad structures 110 disclosed herein. Further, FIGS. 4-8 share a number of elements with others of the accompanying drawings; these elements may take the form of any of the embodiments disclosed herein, and a discussion of these elements is not repeated for ease of illustration.

Figure 4:
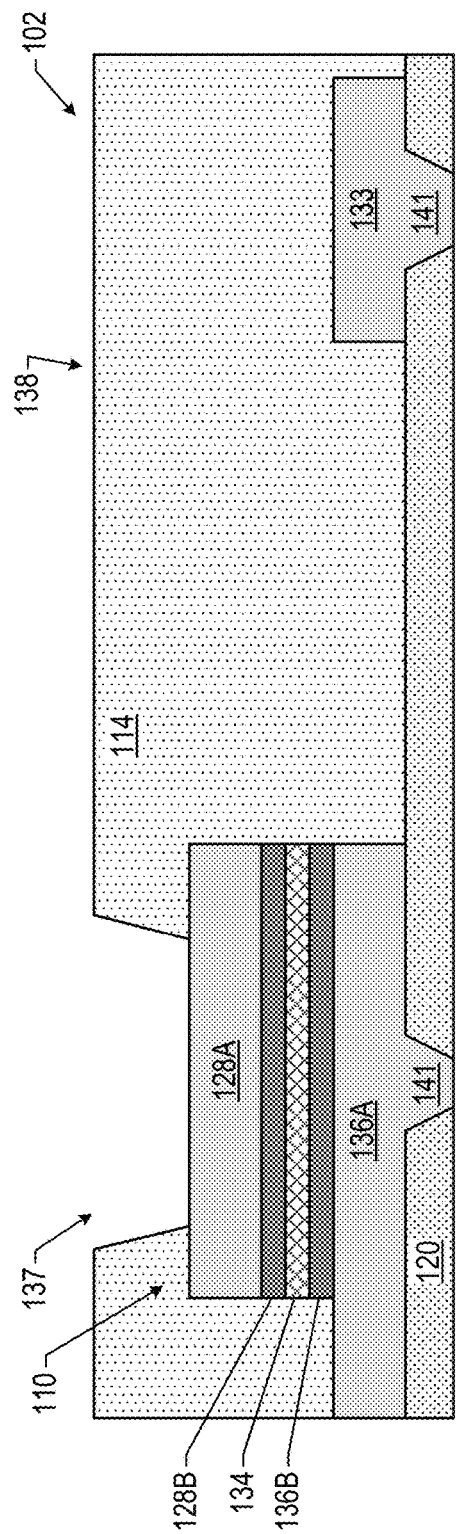
FIGS. 4-8 are side, cross-sectional views of other example capacitor-wirebond pad structures, in accordance with various embodiments.

FIG. 4 illustrates a package substrate 102 including a capacitor-wirebond pad structure 110 whose profile does not include a "step," in contrast to the embodiment of FIG. 2. In FIG. 4, the rightmost side surfaces of the first capacitor plate 128 and the capacitor dielectric 134 are aligned with the rightmost side surface of the second capacitor plate 136. In still other embodiments, one or more side surfaces of the capacitor dielectric 134 may be aligned with corresponding side surfaces of the second capacitor plate 136, but may not be aligned with corresponding side surfaces of the first capacitor plate 128.

Figure 5:
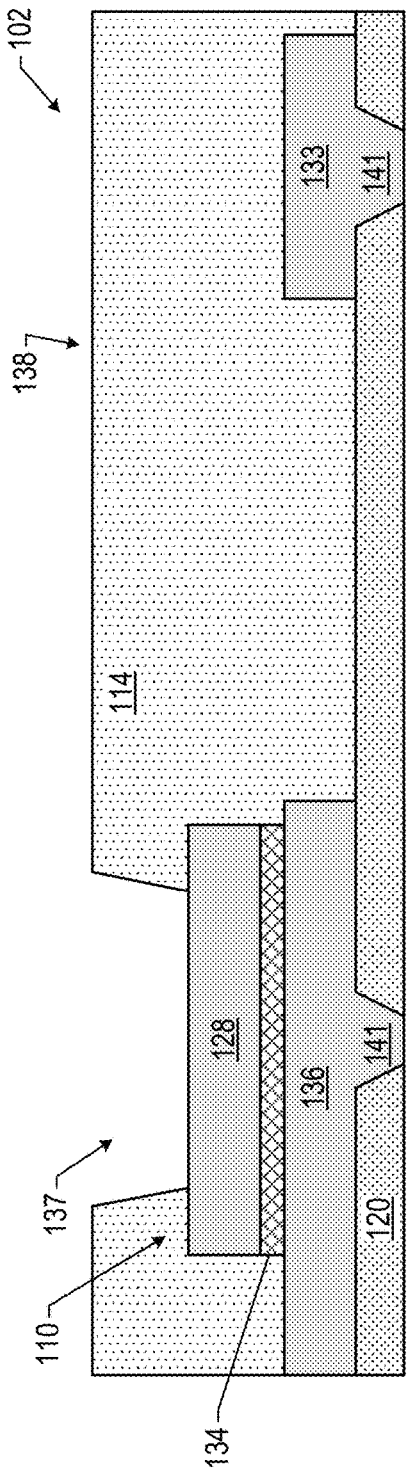

FIG. 5 illustrates a package substrate 102 including a capacitor-wirebond pad structure 110 in which the first capacitor plate 128 does not include different materials (and instead has a substantially uniform material composition) and the second capacitor plate 136 does not include different materials (and instead has a substantially uniform material composition). The first capacitor plate 128 of FIG. 5 may include any of the materials and dimensions discussed above with reference to the first material 128A, and the second capacitor plate 136 of FIG. 5 may include any of the materials and dimensions discussed above with reference to the first material 136A. Such embodiments may be particularly advantageous when the material of the first capacitor plate 128 (second capacitor plate 136) has a favorable band alignment with the capacitor dielectric 134, and when the second capacitor plate 136 may be made to have a clean (e.g., oxide-free) surface for subsequent deposition of the capacitor dielectric 134. In some embodiments, the first capacitor plate 128 may include multiple different materials while the second capacitor plate 136 does not, or the second capacitor plate 136 may include multiple different materials while the first capacitor plate 128 does not.

Figure 6:
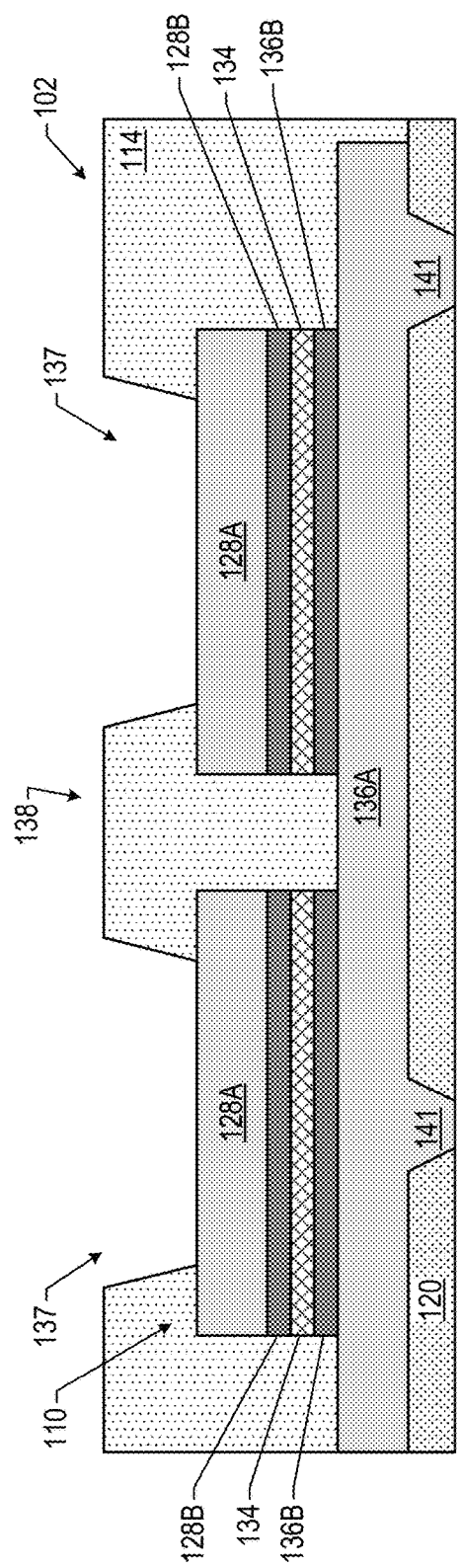

FIG. 6 illustrates a package substrate 102 including a capacitor-wirebond pad structure 110 in which there are two first capacitor plates 128 (each serving as a wirebond pad, and exposed by a corresponding opening 137 in the resist material 114) and a substantially shared second capacitor plate 136. In particular, in the embodiment of FIG. 6, the first material 136A of the second capacitor plate 136 spans the shadows of both first capacitor plates 128. Separate portions of capacitor dielectric 134 and second material 1368 are under the separate first capacitor plates 128, but in other embodiments, the capacitor dielectric 134 and the second material 1368 may span the shadows of both first capacitor plates.

Figure 7:
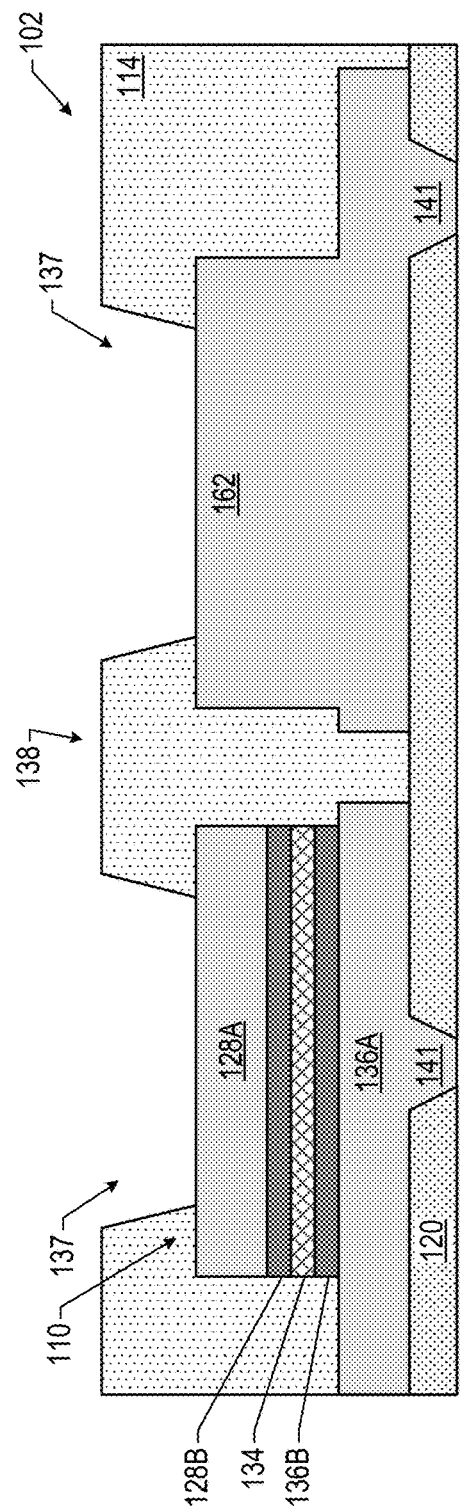

FIG. 7 illustrates a package substrate 102 including a capacitor-wirebond pad structure 110 adjacent to a "conventional" wirebond pad 162 exposed by a corresponding opening 137 in the resist material 114. FIG. 7 illustrates that capacitor-wirebond pad structures 110 may be utilized in package substrates 102 alongside wirebond pads 162 that do not include integrated capacitors (in accordance with any known architecture). Wirebond pads 162 may be signal (e.g., an input/output pad for an RF matching network), ground, or power pads, as desired.

Figure 8:
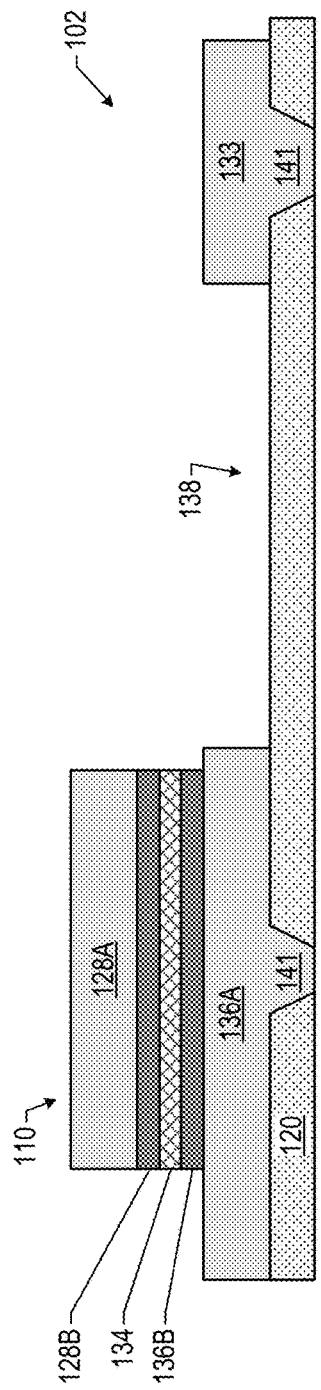

FIG. 8 illustrates a package substrate 102 including a capacitor-wirebond pad structure 110, and not including a resist material 114. In any of the embodiments disclosed herein, a resist material 114 may be omitted, as desired.

Figure 9:
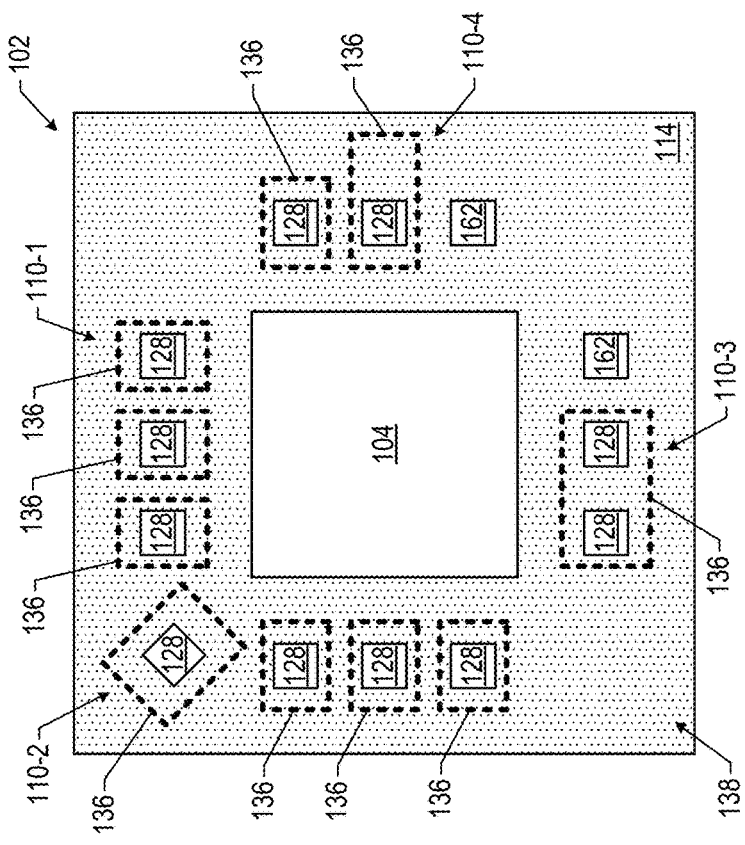
FIG. 9 is a top view of an example arrangement of multiple capacitor-wirebond pad structures in a package substrate, in accordance with various embodiments.

As noted above, multiple capacitor-wirebond pad structures 110 and/or conventional wirebond pads 162 may be used in a package substrate 102. FIG. 9 is a top view of an example arrangement of multiple capacitor-wirebond pad structures 110 in a package substrate 102, in accordance with various embodiments. The first capacitor plates 128 are shown, and the underlying second capacitor plates 136 are represented using dotted lines. A die 104 is also shown; bondwires 164 (not shown) may couple the die 104 to each of the first capacitor plates 128 and to each of the conventional wirebond pads 162. FIG. 9 illustrates a number of different embodiments that may be used alone or in any suitable combination. For example, FIG. 9 illustrates a number of capacitor-wirebond pad structures 110-1 in which the first capacitor plate 128 is centered over a larger second capacitor plate 136. FIG. 9 illustrates a capacitor-wirebond pad structure 110-2 in which the second capacitor plate 136 is significantly larger than the first capacitor plate 128. FIG. 9 illustrates a capacitor-wirebond pad structure 110-3 including two first capacitor plates 128 and a single, shared second capacitor plate 136 (e.g., as discussed above with reference to FIG. 6). FIG. 9 also illustrates a capacitor-wirebond pad structure 110-4 in which the first capacitor plate 128 is not centered with respect to the underlying second capacitor plate 136.

FIG. 9 illustrates the first capacitor plates 128 and second capacitor plates 136 as having rectangular footprints, but the first capacitor plates, capacitor dielectric 134, and second capacitor plates 136 may have any desired footprint shape (e.g., circular, oval, square, rounded, triangular, polygonal, etc.).

The IC packages 100 and capacitor-wirebond pad structures 110 disclosed herein may include, or may be included in, any suitable electronic component. FIGS. 10-14 illustrate various examples of apparatuses that may be included in any of the IC packages 100 disclosed herein, or may include any of the IC packages 100 disclosed herein.

Figure 10:
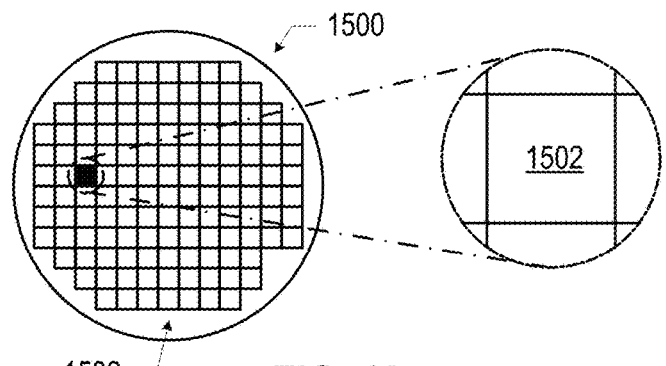
FIG. 10 is a top view of a wafer and dies that may be part of an IC package including any of the capacitor-wirebond pad structures disclosed herein.

FIG. 10 is a top view of a wafer 1500 and dies 1502 that may be included in an IC package 100, in accordance with various embodiments. For example, a die 1502 may be the IC die 104. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 11, discussed below) and/or supporting circuitry to route electrical signals to the transistors, as well as any other IC components. In some embodiments, the wafer 1500 or the die 1502 may include a power amplifier (PA), one or more resonators, one or more switches, one or more lasers, a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
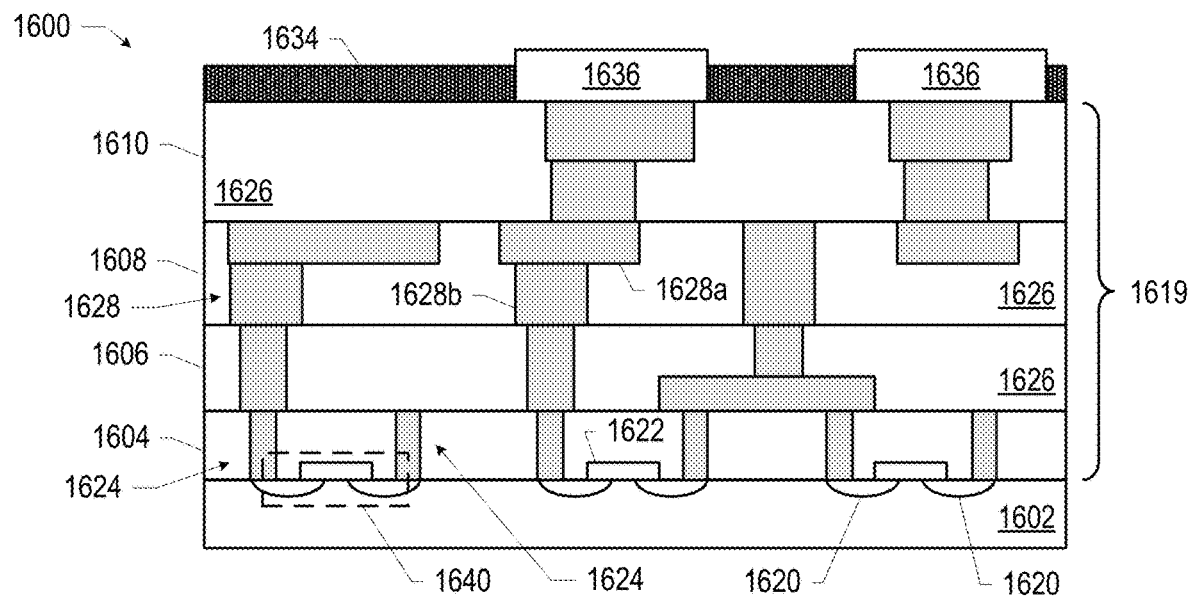
FIG. 11 is a side, cross-sectional view of an IC device that may be part of an IC package including any of the capacitor-wirebond pad structures disclosed herein.

FIG. 11 is a side, cross-sectional view of an IC device 1600 that may be included in an IC package 100, in accordance with various embodiments. For example, the IC device 1600 may be included in a die 1502 (e.g., in the IC die 104). One or more of the IC devices 1600 may be included in one or more dies 1502 (FIG. 10). The IC device 1600 may be formed on a substrate 1602 (e.g., the wafer 1500 of FIG. 10) and may be included in a die (e.g., the die 1502 of FIG. 10). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 10) or a wafer (e.g., the wafer 1500 of FIG. 10).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 11. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 11. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual Damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 11, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 12:
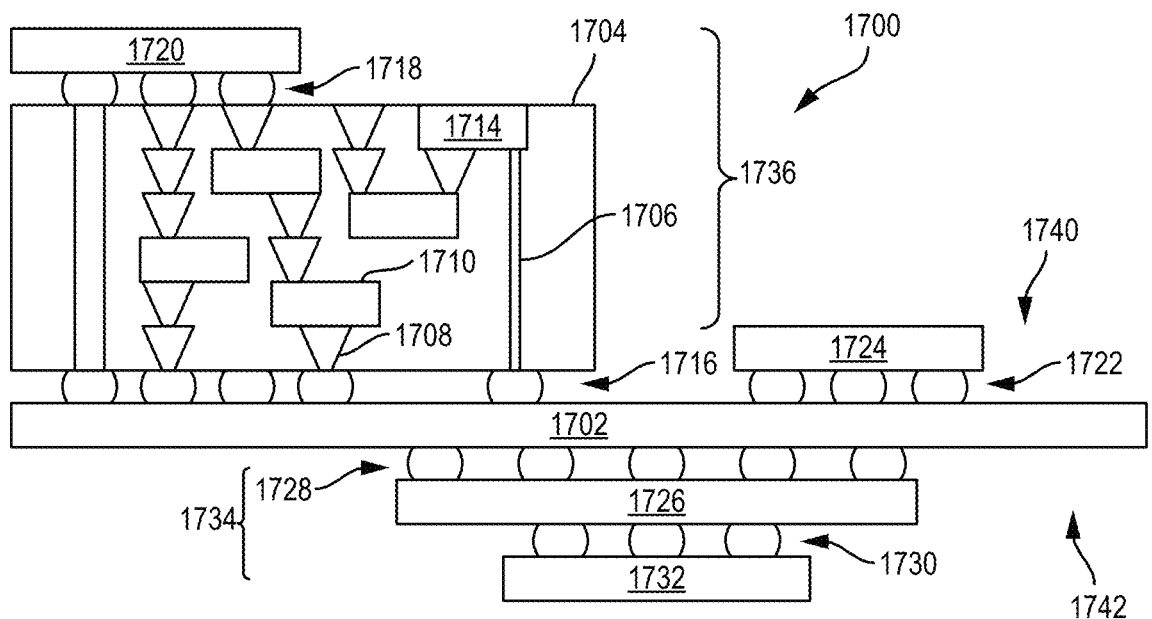
FIG. 12 is a side, cross-sectional view of an IC assembly that may include an IC package including any of the capacitor-wirebond pad structures disclosed herein.

FIG. 12 is a side, cross-sectional view of an IC assembly 1700 that may include one or more IC packages 100, in accordance with various embodiments. For example, any of the IC packages included in the IC assembly 1700 may be an IC package 100 including any of the capacitor-wirebond pad structures 110 (or combination of capacitor-wirebond pad structures 110) disclosed herein. The IC assembly 1700 includes a number of components disposed on a circuit board 1702 (which may be, e.g., a motherboard). The IC assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 10), an IC device (e.g., the IC device 1600 of FIG. 11), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 12, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 13:
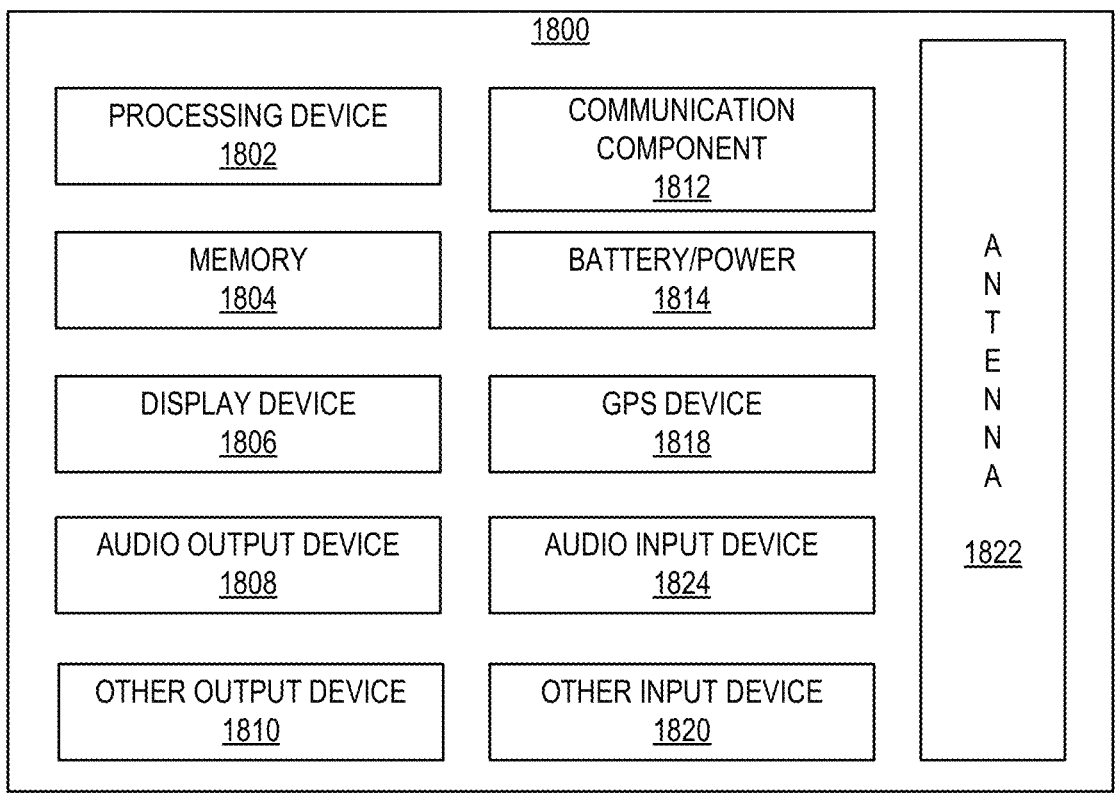
FIG. 13 is a block diagram of an example electrical device that may include an IC package including any of the capacitor-wirebond pad structures disclosed herein.

FIG. 13 is a block diagram of an example electrical device 1800 that may include one or more IC packages 100 or vapor chambers, in accordance with various embodiments. For example, any suitable ones of the components of the electrical device 1800 may include one or more of the IC assemblies 150/1700, IC packages 100, capacitor-wirebond pad structures 110, IC devices 1600, or dies 1502 disclosed herein. A number of components are illustrated in FIG. 13 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 13, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication component 1812 (e.g., one or more communication components). For example, the communication component 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communication component 1812 may include RF components (e.g., power amplifiers and/or resonators) packaged in any of the IC packages 100 disclosed herein.

The communication component 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication component 1812 may manage wired communications, such as electrical, optical, or any other suitable communication protocols (e.g., the Ethernet). As noted above, the communication component 1812 may include multiple communication components. For instance, a first communication component 1812 may be dedicated to shorter-range wireless communications such as Wi-Fi or Bluetooth, and a second communication component 1812 may be dedicated to longer-range wireless communications such as global positioning system (GPS), EDGE, GPRS, CDMA, WiMAX, LTE, EV-DO, or others. In some embodiments, a first communication component 1812 may be dedicated to wireless communications, and a second communication component 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

Figure 14:
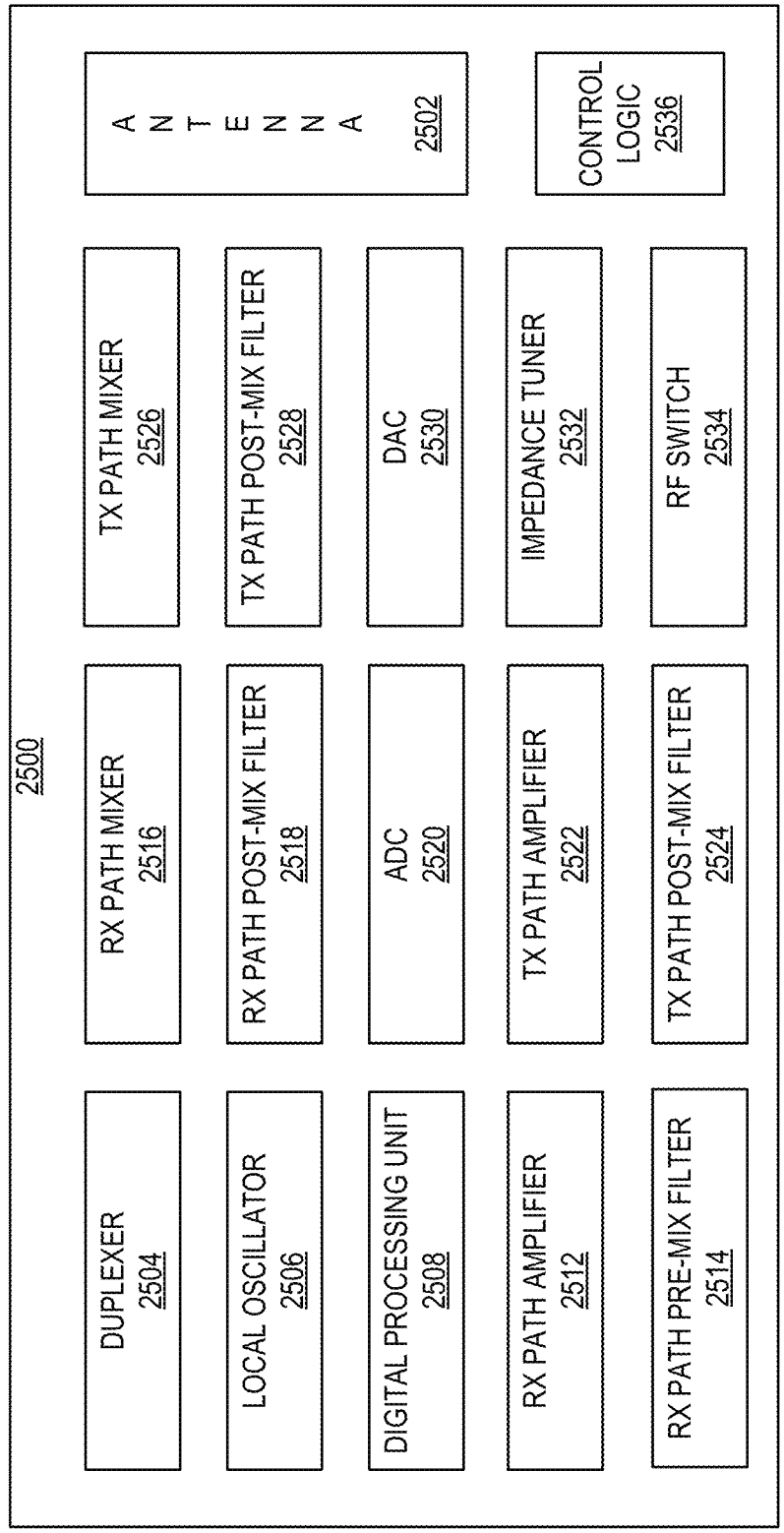
FIG. 14 is a block diagram of an example radio frequency (RF) device that may include an IC package including any of the capacitor-wirebond pad structures disclosed herein.

FIG. 14 is a block diagram of an example RF device 2500 that may include one or more IC packages 100, in accordance with any of the embodiments disclosed herein. For example, any suitable ones of the components of the RF device 2500 may include, or may be included in, an IC package 100 in accordance with any of the embodiments disclosed herein. Any of the components of the RF device 2500 may include, or be included in, an IC assembly 1700 as described with reference to FIG. 12. In some embodiments, the RF device 2500 may be included within any components of the computing device 1800 as described above with reference to FIG. 13 (e.g., the communication component 1812), or may be coupled to any of the components of the electrical device 1800 (e.g., may be coupled to the memory 1804 and/or to the processing device 1802 of the electrical device 1800). In still other embodiments, the RF device 2500 may further include any of the components described above with reference to FIG. 13, such as, but not limited to, the battery/power circuitry 1814, the memory 1804, and various input and output devices as discussed above with reference to FIG. 13.

In general, the RF device 2500 may be any device or system that may support wireless transmission and/or reception of signals in the form of electromagnetic waves in the RF range of approximately 3 kiloHertz (kHz) to 300 gigaHertz (GHz). In some embodiments, the RF device 2500 may be used for wireless communications, e.g., in a base station (BS) or a user equipment (UE) device of any suitable cellular wireless communications technology, such as GSM, WCDMA, or LTE. In a further example, the RF device 2500 may be used as, or in, a BS or a UE device of a millimeter-wave wireless technology such as fifth generation (5G) wireless (e.g., high-frequency/short wavelength spectrum, with frequencies in the range between about 20 and 60 GHz, corresponding to wavelengths in the range between about 5 and 15 millimeters). In yet another example, the RF device 2500 may be used for wireless communications using Wi-Fi technology (e.g., a frequency band of 2.4 GHz, corresponding to a wavelength of about 12 cm, or a frequency band of 5.8 GHz, corresponding to a wavelength of about 5 cm). For example, the RF device 2500 may be included in a Wi-Fi-enabled device such as a desktop, a laptop, a video game console, a smart phone, a tablet, a smart TV, a digital audio player, a car, a printer, etc. In some implementations, a Wi-Fi-enabled device may be a node (e.g., a smart sensor) in a smart system configured to communicate data with other nodes. In another example, the RF device 2500 may be used for wireless communications using Bluetooth technology (e.g., a frequency band from about 2.4 to about 2.485 GHz, corresponding to a wavelength of about 12 cm). In other embodiments, the RF device 2500 may be used for transmitting and/or receiving RF signals for purposes other than communication (e.g., in an automotive radar system, or in medical applications such as magnetic resonance imaging (MRI)).

In various embodiments, the RF device 2500 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 14 as included in the RF device 2500, but any one or more of these components may be omitted or duplicated, as suitable for the application. For example, in some embodiments, the RF device 2500 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2500 may be an RF device supporting only wireless reception (e.g., an RF receiver), in which case it may include the components of the RX path, but not the components of the TX path; or the RF device 2500 may be an RF device supporting only wireless transmission (e.g., an RF transmitter), in which case it may include the components of the TX path, but not the components of the RX path.

In some embodiments, some or all of the components included in the RF device 2500 may be attached to one or more motherboards. In various embodiments, the RF device 2500 may not include one or more of the components illustrated in FIG. 14, but the RF device 2500 may include interface circuitry for coupling to the one or more components. For example, the RF device 2500 may not include an antenna 2502, but may include antenna interface circuitry (e.g., a matching circuitry, a connector and driver circuitry) to which an antenna 2502 may be coupled. In another set of examples, the RF device 2500 may not include a digital processing unit 2508 or a local oscillator 2506, but may include device interface circuitry (e.g., connectors and supporting circuitry) to which a digital processing unit 2508 or a local oscillator 2506 may be coupled.

As shown in FIG. 14, the RF device 2500 may include an antenna 2502, a duplexer 2504, a local oscillator 2506, and a digital processing unit 2508. As also shown in FIG. 14, the RF device 2500 may include an RX path that may include an RX path amplifier 2512 (which may include a PA and/or switches that may be included in the IC die 104), an RX path pre-mix filter 2514, a RX path mixer 2516, an RX path post-mix filter 2518, and an analog-to-digital converter (ADC) 2520. As further shown in FIG. 14, the RF device 2500 may include a TX path that may include a TX path amplifier 2522 (which may include a PA and/or switches that may be included in the IC die 104), a TX path post-mix filter 2524, a TX path mixer 2526, a TX path pre-mix filter 2528, and a digital-to-analog converter (DAC) 2530. Still further, the RF device 2500 may further include an impedance tuner 2532, an RF switch 2534 (which may include, or be included in, the IC die 104), and control logic 2536. In various embodiments, the RF device 2500 may include multiple instances of any of the components shown in FIG. 14. In some embodiments, the RX path amplifier 2512, the TX path amplifier 2522, the duplexer 2504, and the RF switch 2534 may be considered to form, or be a part of, an RF front-end (FE) of the RF device 2500. In some embodiments, the RX path amplifier 2512, the TX path amplifier 2522, the duplexer 2504, and the RF switch 2534 may be considered to form, or be a part of, an RF FE of the RF device 2500. In some embodiments, the RX path mixer 2516 and the TX path mixer 2526 (possibly with their associated pre-mix and post-mix filters shown in FIG. 14) may be considered to form, or be a part of, an RF transceiver of the RF device 2500 (or of an RF receiver or an RF transmitter if only RX path or TX path components, respectively, are included in the RF device 2500). In some embodiments, the RF device 2500 may further include one or more control logic elements/circuits, shown in FIG. 14 as control logic 2536 (providing, for example, an RF FE control interface). The control logic 2536 may be used to enhance control of complex RF system environment, support implementation of envelope tracking techniques, reduce dissipated power, etc.

The antenna 2502 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2500 is an FDD transceiver, the antenna 2502 may be configured for concurrent reception and transmission of communication signals in separate, e.g., non-overlapping and non-continuous, bands of frequencies, e.g., in bands having a separation of, e.g., 20 MHz from one another. If the RF device 2500 is a TDD transceiver, the antenna 2502 may be configured for sequential reception and transmission of communication signals in bands of frequencies that may be the same, or overlapping for TX and RX paths. In some embodiments, the RF device 2500 may be a multi-band RF device, in which case the antenna 2502 may be configured for concurrent reception of signals having multiple RF components in separate frequency bands and/or configured for concurrent transmission of signals having multiple RF components in separate frequency bands. In such embodiments, the antenna 2502 may be a single wide-band antenna or a plurality of band-specific antennas (e.g., a plurality of antennas each configured to receive and/or transmit signals in a specific band of frequencies). In various embodiments, the antenna 2502 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2500 may include more than one antenna 2502 to implement antenna diversity. In some such embodiments, the RF switch 2534 may be deployed to switch between different antennas.

An output of the antenna 2502 may be coupled to the input of the duplexer 2504. The duplexer 2504 may be any suitable component configured for filtering multiple signals to allow for bidirectional communication over a single path between the duplexer 2504 and the antenna 2502. The duplexer 2504 may be configured for providing RX signals to the RX path of the RF device 2500 and for receiving TX signals from the TX path of the RF device 2500.

The RF device 2500 may include one or more local oscillators 2506, configured to provide local oscillator signals that may be used for downconversion of the RF signals received by the antenna 2502 and/or upconversion of the signals to be transmitted by the antenna 2502.

The RF device 2500 may include the digital processing unit 2508, which may include one or more processing devices. In some embodiments, the digital processing unit 2508 may be implemented as the processing device 1802 of FIG. 13, descriptions of which are provided above. The digital processing unit 2508 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 14, in some embodiments, the RF device 2500 may further include a memory device (e.g., the memory device 1804 described above with reference to FIG. 13) configured to cooperate with the digital processing unit 2508.

Turning to the details of the RX path that may be included in the RF device 2500, the RX path amplifier 2512 may include a low noise amplifier (LNA). An input of the RX path amplifier 2512 may be coupled to an antenna port (not shown) of the antenna 2502, e.g., via the duplexer 2504. The RX path amplifier 2512 may amplify the RF signals received by the antenna 2502.

An output of the RX path amplifier 2512 may be coupled to an input of the RX path pre-mix filter 2514, which may be a harmonic or band-pass (e.g., low-pass) filter, configured to filter received RF signals that have been amplified by the RX path amplifier 2512.

An output of the RX path pre-mix filter 2514 may be coupled to an input of the RX path mixer 2516, also referred to as a downconverter. The RX path mixer 2516 may include two inputs and one output. A first input may be configured to receive the RX signals, which may be current signals, indicative of the signals received by the antenna 2502 (e.g., the first input may receive the output of the RX path pre-mix filter 2514). A second input may be configured to receive local oscillator signals from one of the local oscillators 2506. The RX path mixer 2516 may then mix the signals received at its two inputs to generate a downconverted RX signal, provided at an output of the RX path mixer 2516. As used herein, downconversion refers to a process of mixing a received RF signal with a local oscillator signal to generate a signal of a lower frequency. In particular, the RX path mixer (e.g., downconverter) 2516 may be configured to generate the sum and/or the difference frequency at the output port when two input frequencies are provided at the two input ports. In some embodiments, the RF device 2500 may implement a direct-conversion receiver (DCR), also known as homodyne, synchrodyne, or zero-intermediate frequency (IF) receiver, in which case the RX path mixer 2516 may be configured to demodulate the incoming radio signals using local oscillator signals whose frequency is identical to, or very close to the carrier frequency of the radio signal. In other embodiments, the RF device 2500 may make use of downconversion to an IF. IFs may be used in superheterodyne radio receivers, in which a received RF signal is shifted to an IF, before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2516 may include several such stages of IF conversion.

Although a single RX path mixer 2516 is shown in the RX path of FIG. 14, in some embodiments, the RX path mixer 2516 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2502 and an in-phase component of the local oscillator signal provided by the local oscillator 2506. The second RX path mixer may be configured for performing downconversion to generate a quadrature (Q) downconverted RX signal by mixing the RX signal received by the antenna 2502 and a quadrature component of the local oscillator signal provided by the local oscillator 2506 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2516 may, optionally, be coupled to the RX path post-mix filter 2518, which may be low-pass filters. In case the RX path mixer 2516 is a quadrature mixer that implements the first and second mixers as described above, the in-phase and quadrature components provided at the outputs of the first and second mixers respectively may be coupled to respective individual first and second RX path post-mix filters included in the RX path post-mix filter 2518.

The ADC 2520 may be configured to convert the mixed RX signals from the RX path mixer 2516 from the analog to the digital domain. The ADC 2520 may be a quadrature ADC that, similar to the RX path mixer 2516, may include two ADCs, configured to digitize the downconverted RX path signals separated in in-phase and quadrature components. The output of the ADC 2520 may be provided to the digital processing unit 2508, configured to perform various functions related to digital processing of the RX signals so that information encoded in the RX signals can be extracted.

Turning to the details of the TX path that may be included in the RF device 2500, the digital signal to later be transmitted (TX signal) by the antenna 2502 may be provided, from the digital processing unit 2508, to the DAC 2530. Similar to the ADC 2520, the DAC 2530 may include two DACs, configured to convert, respectively, digital I- and Q-path TX signal components to analog form.

Optionally, the output of the DAC 2530 may be coupled to the TX path pre-mix filter 2528, which may be a bandpass (e.g., low-pass) filter (or a pair of band-pass, e.g., low-pass, filters, in case of quadrature processing) configured to filter out, from the analog TX signals output by the DAC 2530, the signal components outside of the desired band. The digital TX signals may then be provided to the TX path mixer 2526, which may also be referred to as an upconverter. Similar to the RX path mixer 2516, the TX path mixer 2526 may include a pair of TX path mixers, for in-phase and quadrature component mixing. Similar to the first and second RX path mixers that may be included in the RX path, each of the TX path mixers of the TX path mixer 2526 may include two inputs and one output. A first input may receive the TX signal components, converted to the analog form by the respective DAC 2530, which are to be upconverted to generate RF signals to be transmitted. The first TX path mixer may generate an in-phase (I) upconverted signal by mixing the TX signal component converted to analog form by the DAC 2530 with the in-phase component of the TX path local oscillator signal provided from the local oscillator 2506 (in various embodiments, the local oscillator 2506 may include a plurality of different local oscillators, or be configured to provide different local oscillator frequencies for the RX path mixer 2516 in the RX path and the TX path mixer 2526 in the TX path). The second TX path mixer may generate a quadrature phase (Q) upconverted signal by mixing the TX signal component converted to analog form by the DAC 2530 with the quadrature component of the TX path local oscillator signal. The output of the second TX path mixer may be added to the output of the first TX path mixer to create a real RF signal. A second input of each of the TX path mixers may be coupled the local oscillator 2506.

Optionally, the RF device 2500 may include the TX path post-mix filter 2524, configured to filter the output of the TX path mixer 2526.

As noted above, the TX path amplifier 2522 may be a PA (and may be, for example, included in the IC die 104), configured to amplify the upconverted RF signal before providing it to the antenna 2502 for transmission In various embodiments, any of the RX path pre-mix filter 2514, the RX path post-mix filter 2518, the TX path post-mix filter 2524, and the TX path pre-mix filter 2528 may be implemented as RF filters. In some embodiments, each of such RF filters may include one or more resonators (e.g., AWRs, film bulk acoustic resonators (FBARs), Lamb wave resonators, and/or contour-wave resonators), arranged in any suitable manner (e.g., in a ladder configuration). Any of the RX path pre-mix filter 2514, the RX path post-mix filter 2518, the TX path post-mix filter 2524, and the TX path pre-mix filter 2528 may include one or more resonators. An individual resonator of an RF filter may include a layer of a piezoelectric material such as aluminum nitride, enclosed between a bottom electrode and a top electrode, with a cavity provided around a portion of each electrode in order to allow a portion of the piezoelectric material to vibrate during operation of the filter. Any such resonators may be included in an IC package 100 (e.g., in the IC die 104). In some embodiments, an RF filter may be implemented as a plurality of RF filters, or a filter bank. A filter bank may include a plurality of RF resonators that may be coupled to a switch (e.g., the RF switch 2534) configured to selectively switch any one of the plurality of RF resonators on and off (e.g., activate any one of the plurality of RF resonators), in order to achieve desired filtering characteristics of the filter bank (e.g., in order to program the filter bank). For example, such a filter bank may be used to switch between different RF frequency ranges when the RF device 2500 is, or is included in, a BS or in a UE device. In another example, such a filter bank may be programmable to suppress TX leakage on the different duplex distances.

The impedance tuner 2532 may include any suitable circuitry, configured to match the input and output impedances of the different RF circuitries to minimize signal losses in the RF device 2500. For example, the impedance tuner 2532 may include an antenna impedance tuner. Being able to tune the impedance of the antenna 2502 may be particularly advantageous because antenna's impedance is a function of the environment that the RF device 2500 is in, e.g., antenna's impedance changes depending on, e.g., if the antenna is held in a hand, placed on a car roof, etc.

As described above, the RF switch 2534 may be a device configured to route high-frequency signals through transmission paths in order to selectively switch between a plurality of instances of any one of the components shown in FIG. 14 (e.g., to achieve desired behavior and characteristics of the RF device 2500). The RF switch 2534 may be included in an IC die 104. In some embodiments, an RF switch 2534 may be used to switch between different antennas 2502. In other embodiments, an RF switch may be used to switch between a plurality of RF resonators (e.g., by selectively switching RF resonators on and off) of any of the filters included in the RF device 2500. Typically, an RF system may include a plurality of such RF switches.

The RF device 2500 provides a simplified version and, in further embodiments, other components not specifically shown in FIG. 14 may be included. For example, the RX path of the RF device 2500 may include a current-to-voltage amplifier between the RX path mixer 2516 and the ADC 2520, which may be configured to amplify and convert the downconverted signals to voltage signals. In another example, the RX path of the RF device 2500 may include a balun transformer for generating balanced signals. In yet another example, the RF device 2500 may further include a clock generator, which may include a suitable phase-lock loop (PLL), configured to receive a reference clock signal and use it to generate a different clock signal that may then be used for timing the operation of the ADC 2520, the DAC 2530, and/or that may also be used by the local oscillator 2506 to generate the local oscillator signals to be used in the RX path or the TX path.

The following paragraphs provide various examples of the embodiments disclosed herein.

Example 1 is an integrated circuit (IC) package support, including: a capacitor-wirebond pad structure, wherein the capacitor-wirebond pad structure includes a wirebond pad, a capacitor plate, and a high-k dielectric between the wirebond pad and the capacitor plate.

Example 2 includes the subject matter of Example 1, and further specifies that the wirebond pad includes a first metal region and a second metal region having a different material composition than the first metal region, wherein the second metal region is between the first metal region and the high-k dielectric.

Example 3 includes the subject matter of Example 2, and further specifies that the second metal region has a thickness between 5 nanometers and 100 nanometers.

Example 4 includes the subject matter of any of Examples 2-3, and further specifies that the second metal region includes tantalum, zirconium, hafnium, palladium, nickel, or titanium.

Example 5 includes the subject matter of any of Examples 2-4, and further specifies that the first metal region includes copper, nickel, gold, platinum, or palladium.

Example 6 includes the subject matter of any of Examples 1-5, and further specifies that the high-k dielectric includes tantalum and oxygen; zirconium and oxygen; hafnium and oxygen; barium, strontium, titanium, and oxygen; barium, titanium, and oxygen; or titanium and oxygen.

Example 7 includes the subject matter of any of Examples 1-6, and further specifies that the high-k dielectric has a thickness between 5 nanometers and 400 nanometers.

Example 8 includes the subject matter of any of Examples 1-7, and further specifies that the capacitor plate includes a first metal region and a second metal region having a different material composition than the first metal region, and the second metal region is between the first metal region and the high-k dielectric.

Example 9 includes the subject matter of Example 8, and further specifies that the second metal region has a thickness between 5 nanometers and 100 nanometers.

Example 10 includes the subject matter of any of Examples 8-9, and further specifies that the second metal region includes tantalum, zirconium, hafnium, palladium, nickel, or titanium.

Example 11 includes the subject matter of any of Examples 8-10, and further specifies that the first metal region includes copper, nickel, gold, platinum, or palladium.

Example 12 includes the subject matter of any of Examples 1-11, and further specifies that the wirebond pad has an area between 0.005 square millimeters and 0.5 square millimeters.

Example 13 includes the subject matter of any of Examples 1-12, and further specifies that the capacitor-wirebond pad structure has a capacitance between 1 picofarad and 10 nanofarads.

Example 14 includes the subject matter of any of Examples 1-13, and further specifies that the wirebond pad has a side length between 10 microns and 100 microns.

Example 15 includes the subject matter of any of Examples 1-14, and further includes: a dielectric material in contact with the capacitor plate, wherein the dielectric material has a different material composition than the high-k dielectric.

Example 16 includes the subject matter of Example 15, and further specifies that the dielectric material is an organic dielectric material.

Example 17 includes the subject matter of any of Examples 1-16, and further specifies that the IC package support does not include a conductive via in conductive contact with the wirebond pad.

Example 18 includes the subject matter of any of Examples 1-17, and further specifies that the wirebond pad is a first wirebond pad, the capacitor-wirebond pad structure further includes a second wirebond pad, and the high-k dielectric is between the second wirebond pad and the capacitor plate.

Example 19 includes the subject matter of any of Examples 1-18, and further specifies that the wirebond pad and the capacitor plate have a same area.

Example 20 includes the subject matter of any of Examples 1-18, and further specifies that the wirebond pad and the capacitor plate have different areas.

Example 21 includes the subject matter of any of Examples 1-20, and further includes: a resist material at a surface of the IC package support, wherein the wirebond pad is exposed at a bottom of an opening of the resist material.

Example 22 includes the subject matter of Example 21, and further specifies that the resist material is in contact with the capacitor plate.

Example 23 includes the subject matter of any of Examples 1-22, and further specifies that the wirebond pad is a ground pad or a power pad.

Example 24 includes the subject matter of any of Examples 1-22, and further specifies that the wirebond pad is an input/output pad for a radio frequency (RF) matching network.

Example 25 includes the subject matter of any of Examples 1-24, and further specifies that the IC package support is a package substrate.

Example 26 includes the subject matter of any of Examples 1-24, and further specifies that the IC package support is an interposer.

Example 27 includes the subject matter of any of Examples 1-26, and further specifies that the wirebond pad is a first wirebond pad, the IC package support further includes a second wirebond pad, and the IC package support includes a conductive via in contact with the second wirebond pad.

Example 28 is an integrated circuit (IC) package, including: an IC package support, wherein the IC package support includes a capacitor, and the capacitor includes a first capacitor plate, a second capacitor plate, and a capacitor dielectric between the first capacitor plate and the second capacitor plate; and a die, wherein the die is wirebonded to the first capacitor plate.

Example 29 includes the subject matter of Example 28, and further specifies that the die includes a power amplifier.

Example 30 includes the subject matter of any of Examples 28-29, and further specifies that the IC package is a radio frequency (RF) system-in-package.

Example 31 includes the subject matter of any of Examples 28-30, and further specifies that the capacitor is part of a circuit for delivering power to the die.

Example 32 includes the subject matter of any of Examples 28-31, and further specifies that the first capacitor plate includes a first metal region and a second metal region having a different material composition than the first metal region, wherein the second metal region is between the first metal region and the capacitor dielectric.

Example 33 includes the subject matter of Example 32, and further specifies that the second metal region has a thickness between 5 nanometers and 100 nanometers.

Example 34 includes the subject matter of any of Examples 32-33, and further specifies that the second metal region includes tantalum, zirconium, palladium, nickel, hafnium, or titanium.

Example 35 includes the subject matter of any of Examples 32-34, and further specifies that the first metal region includes copper, nickel, gold, platinum, or palladium.

Example 36 includes the subject matter of any of Examples 28-35, and further specifies that the capacitor dielectric includes tantalum and oxygen; zirconium and oxygen; hafnium and oxygen; barium, strontium, titanium, and oxygen; barium, titanium, and oxygen; or titanium and oxygen.

Example 37 includes the subject matter of any of Examples 28-36, and further specifies that the capacitor dielectric has a thickness between 5 nanometers and 400 nanometers.

Example 38 includes the subject matter of any of Examples 28-37, and further specifies that the second capacitor plate includes a first metal region and a second metal region having a different material composition than the first metal region, and the second metal region is between the first metal region and the capacitor dielectric.

Example 39 includes the subject matter of Example 38, and further specifies that the second metal region has a thickness between 5 nanometers and 100 nanometers.

Example 40 includes the subject matter of any of Examples 38-39, and further specifies that the second metal region includes tantalum, zirconium, palladium, nickel, hafnium, or titanium.

Example 41 includes the subject matter of any of Examples 38-40, and further specifies that the first metal region includes copper, nickel, gold, platinum, or palladium.

Example 42 includes the subject matter of any of Examples 28-41, and further specifies that the first capacitor plate has an area between 0.005 square millimeters and 0.5 square millimeters.

Example 43 includes the subject matter of any of Examples 28-42, and further specifies that the capacitor has a capacitance between 1 picofarad and 10 nanofarads.

Example 44 includes the subject matter of any of Examples 28-43, and further specifies that the first capacitor plate has a side length between 10 microns and 100 microns.

Example 45 includes the subject matter of any of Examples 28-44, and further specifies that the IC package support further includes: a dielectric material in contact with the second capacitor plate, wherein the dielectric material has a different material composition than the capacitor dielectric.

Example 46 includes the subject matter of any of Examples 45, and further specifies that the dielectric material is an organic dielectric material.

Example 47 includes the subject matter of Example 28-46, and further specifies that the IC package support does not include a conductive via in conductive contact with the first capacitor plate.

Example 48 includes the subject matter of any of Examples 28-47, and further specifies that the capacitor further includes a third capacitor plate, the capacitor dielectric is between the second capacitor plate and the third capacitor plate, and the die is wirebonded to the third capacitor plate.

Example 49 includes the subject matter of any of Examples 28-48, and further specifies that the first capacitor plate and the second capacitor plate have a same area.

Example 50 includes the subject matter of any of Examples 28-48, and further specifies that the first capacitor plate and the second capacitor plate have different areas.

Example 51 includes the subject matter of any of Examples 28-50, and further specifies that the IC package support further includes: a resist material at a surface of the IC package support, wherein the first capacitor plate is exposed at a bottom of an opening of the resist material.

Example 52 includes the subject matter of Example 51, and further specifies that the resist material is in contact with the second capacitor plate.

Example 53 includes the subject matter of any of Examples 28-52, and further specifies that the first capacitor plate is a ground pad or a power pad.

Example 54 includes the subject matter of any of Examples 28-53, and further specifies that the first capacitor plate is an input/output pad for a radio frequency (RF) matching network.

Example 55 includes the subject matter of any of Examples 28-54, and further specifies that the IC package support is a package substrate.

Example 56 includes the subject matter of any of Examples 28-54, and further specifies that the IC package support is an interposer.

Example 57 includes the subject matter of any of Examples 28-56, and further specifies that the IC package support further includes a wirebond pad and a conductive via in contact with the wirebond pad, and the die is wirebonded to the wirebond pad.

Example 58 is a computing device, including: an integrated circuit (IC) package support, wherein the IC package includes an electronic component wirebonded to a conductive portion of a support, and the conductive portion is a plate of a capacitor.

Example 59 includes the subject matter of Example 58, and further specifies that the electronic component includes a power amplifier.

Example 60 includes the subject matter of any of Examples 58-59, and further specifies that the IC package is a radio frequency (RF) system-in-package.

Example 61 includes the subject matter of any of Examples 58-60, and further specifies that the capacitor is part of a circuit for delivering power to the electronic component.

Example 62 includes the subject matter of any of Examples 58-61, and further specifies that the conductive portion includes a first metal region and a second metal region having a different material composition than the first metal region, wherein the second metal region is between the first metal region and a capacitor dielectric of the capacitor.

Example 63 includes the subject matter of Example 62, and further specifies that the second metal region has a thickness between 5 nanometers and 100 nanometers.

Example 64 includes the subject matter of any of Examples 62-63, and further specifies that the second metal region includes tantalum, zirconium, palladium, nickel, hafnium, or titanium.

Example 65 includes the subject matter of any of Examples 62-64, and further specifies that the first metal region includes copper, nickel, gold, platinum, or palladium.

Example 66 includes the subject matter of any of Examples 58-65, and further specifies that a capacitor dielectric of the capacitor includes tantalum and oxygen; zirconium and oxygen; hafnium and oxygen; barium, strontium, titanium, and oxygen; barium, titanium, and oxygen; or titanium and oxygen.

Example 67 includes the subject matter of any of Examples 58-66, and further specifies that a capacitor dielectric of the capacitor has a thickness between 5 nanometers and 400 nanometers.

Example 68 includes the subject matter of any of Examples 58-67, and further specifies that the capacitor includes a second conductive portion, the second conductive portion includes a first metal region and a second metal region having a different material composition than the first metal region, and the second metal region is between the first metal region and a capacitor dielectric of the capacitor.

Example 69 includes the subject matter of any of Examples 68, and further specifies that the second metal region has a thickness between 5 nanometers and 100 nanometers.

Example 70 includes the subject matter of any of Examples 68-69, and further specifies that the second metal region includes tantalum, zirconium, palladium, nickel, hafnium, or titanium.

Example 71 includes the subject matter of any of Examples 68-70, and further specifies that the first metal region includes copper, nickel, gold, platinum, or palladium.

Example 72 includes the subject matter of any of Examples 58-71, and further specifies that the conductive portion has an area between 0.005 square millimeters and 0.5 square millimeters.

Example 73 includes the subject matter of any of Examples 58-72, and further specifies that the capacitor has a capacitance between 1 picofarad and 10 nanofarads.

Example 74 includes the subject matter of any of Examples 58-73, and further specifies that the conductive portion has a side length between 10 microns and 100 microns.

Example 75 includes the subject matter of any of Examples 58-74, and further specifies that the capacitor includes a second conductive portion, the second conductive portion is a plate of the capacitor, and the IC package further includes: a dielectric material in contact with the second conductive portion, wherein the dielectric material has a different material composition than a capacitor dielectric of the capacitor.

Example 76 includes the subject matter of Example 75, and further specifies that the dielectric material is an organic dielectric material.

Example 77 includes the subject matter of any of Examples 58-76, and further specifies that the IC package does not include a conductive via in conductive contact with the conductive portion.

Example 78 includes the subject matter of any of Examples 58-77, and further specifies that the conductive portion is a first conductive portion, the IC package further includes a second conductive portion, the electronic component is wirebonded to the second conductive portion, and the second conductive portion is a plate of a capacitor.

Example 79 includes the subject matter of any of Examples 58-78, and further specifies that plates of the capacitor have a same area.

Example 80 includes the subject matter of any of Examples 58-78, and further specifies that plates of the capacitor have different areas.

Example 81 includes the subject matter of any of Examples 58-80, and further specifies that the IC package further includes a resist material at a surface of an IC package support, wherein the conductive portion is exposed at a bottom of an opening of the resist material.

Example 82 includes the subject matter of Example 81, and further specifies that the resist material is in contact with another plate of the capacitor.

Example 83 includes the subject matter of any of Examples 58-82, and further specifies that the conductive portion is a ground pad or a power pad.

Example 84 includes the subject matter of any of Examples 58-83, and further specifies that the conductive portion is an input/output pad for a radio frequency (RF) matching network.

Example 85 includes the subject matter of any of Examples 58-84, and further specifies that the IC package support is a package substrate.

Example 86 includes the subject matter of any of Examples 58-84, and further specifies that the IC package support is an interposer.

Example 87 includes the subject matter of any of Examples 58-86, and further specifies that the IC package further includes a wirebond pad and a conductive via in contact with the wirebond pad, and the electronic component is wirebonded to the wirebond pad.

Example 88 is a method of manufacturing a capacitor-wirebond pad structure, in accordance with any of the embodiments disclosed herein.

The invention claimed is:

1. An integrated circuit (IC) package support, comprising:
a resist material having an opening; and
a capacitor-wirebond pad structure in contact with the resist material, the capacitor-wirebond pad structure including:
 a wirebond pad exposed through the opening in the resist material and configured to bond with a bondwire of a die;
 a capacitor plate electrically coupled to a conductive via in a dielectric of the package support; and
 a high-k dielectric between the wirebond pad and the capacitor plate, wherein:
  the wirebond pad and the capacitor plate are plates of a capacitor,
  the high-k dielectric is a dielectric of the capacitor,
  the wirebond pad includes a first metal region and a second metal region,
  the first metal region is exposed through the opening in the resist material,
  the second metal region is between the first metal region and the high-k dielectric,
  the capacitor plate includes a third metal region and a fourth metal region,
  the fourth metal region is between the third metal region and the high-k dielectric,
  the third metal region is electrically coupled to the conductive via,
  the first metal region and the third metal region comprise a first metallic element,
  the second metal region and the fourth metal region comprise a second metallic element, and
  the high-k dielectric comprises an oxide of the second metallic element.

2. The IC package support of claim 1, wherein the capacitor-wirebond pad structure has a capacitance between 1 picofarad and 10 nanofarads.

3. The IC package support of claim 1, wherein:
the dielectric of the package support is in contact with the capacitor plate, and the dielectric has a different material composition than the high-k dielectric.

4. The IC package support of claim 3, wherein the dielectric is an organic dielectric material.

5. The IC package support of claim 1, wherein the wirebond pad is a first wirebond pad, the capacitor-wirebond pad structure further includes a second wirebond pad, and the high-k dielectric is between the second wirebond pad and the capacitor plate.

6. The IC package support of claim 1,
wherein the resist material is at a surface of the IC package support, and the wirebond pad is exposed at a bottom of an opening of the resist material.

7. The IC package support of claim 6, wherein the resist material is in contact with the capacitor plate.

8. The IC package support of claim 1, wherein the IC package support is a package substrate.

9. The IC package support of claim 1, wherein the IC package support is an interposer.

10. The IC package support of claim 1, wherein the wirebond pad is a first wirebond pad, the IC package support further includes a second wirebond pad, and the IC package support includes a conductive via in contact with the second wirebond pad.

11. The IC package support of claim 1, further comprising a plurality of metal layers and dielectric layers, at least one of the plurality of metal layers in conductive contact with the conductive via.

12. The IC package support of claim 11, wherein the plurality of metal layers comprises the third metal region of the capacitor plate.

13. The IC package support of claim 1, wherein the first metallic element is same as the second metallic element.

14. An integrated circuit (IC) package, comprising:
an IC package support, wherein the IC package support includes:
a resist material having an opening;
a capacitor in the opening of the resist material, and the capacitor includes:
a first capacitor plate comprising a first metal region and a second metal region,
a second capacitor plate conductively unconnected to the second capacitor plate and comprising a third metal region and a fourth metal region, the second metal region and the fourth metal region comprising a metallic element, and
a capacitor dielectric between the second metal region of the first capacitor plate and the fourth metal region of the second capacitor plate, the capacitor dielectric comprising an oxide of the metallic element; and
a die, wherein the die is wirebonded to the first metal region of the first capacitor plate.

15. The IC package of claim 14, wherein the die includes a power amplifier.

16. The IC package of claim 14, wherein the IC package is a radio frequency (RF) system-in-package.

17. The IC package of claim 14, wherein the capacitor is part of a circuit for delivering power to the die.

18. A computing device, comprising:
an integrated circuit (IC) package, wherein the IC package includes:
a support comprising a resist material having an opening; and
an electronic component wirebonded to a conductive portion of the support, wherein:
the conductive portion in the opening, the conductive portion being a first conductive plate of a capacitor, the first conductive plate comprising a first metal region and a second metal region,
the capacitor further comprises:
a second conductive plate comprising a third metal region and a fourth metal region, the second metal region and the fourth metal region comprising a metallic element; and
a dielectric between the second metal region of the first conductive plate and the fourth metal region of the second conductive plate, the dielectric comprising an oxide of the metallic element the first conductive plate being conductively unconnected to the second conductive plate.

19. The computing device of claim 18, wherein plates of the capacitor have different areas.

20. The computing device of claim 18, wherein the IC package further includes a wirebond pad and a conductive via in contact with the wirebond pad, and the electronic component is wirebonded to the wirebond pad.

* * * * *